(12) United States Patent
Fujimura et al.

(10) Patent No.: US 6,239,558 B1
(45) Date of Patent: May 29, 2001

(54) SYSTEM FOR DRIVING A COLD-CATHODE FLUORESCENT LAMP CONNECTED TO A PIEZOELECTRIC TRANSFORMER

(75) Inventors: Takeshi Fujimura; Katsuyuki Ishikawa; Masaaki Toyama, all of Tokyo (JP)

(73) Assignee: Taiheiyo Cement Corporation, Tokyo (JP)

( * ) Notice: Subject to any disclaimer, the term of this patent is extended or adjusted under 35 U.S.C. 154(b) by 0 days.

(21) Appl. No.: 09/242,929

(22) PCT Filed: Aug. 26, 1997

(86) PCT No.: PCT/JP97/02966
§ 371 Date: Feb. 26, 1999
§ 102(e) Date: Feb. 26, 1999

(87) PCT Pub. No.: WO98/09369
PCT Pub. Date: Mar. 5, 1998

(30) Foreign Application Priority Data

| Aug. 29, 1996 | (JP) | 8-228458 |
| Feb. 6, 1997 | (JP) | 9-023867 |
| Feb. 6, 1997 | (JP) | 9-023869 |
| Feb. 6, 1997 | (JP) | 9-023870 |
| May 26, 1997 | (JP) | 9-135188 |

(51) Int. Cl.[7] ................................................. H05B 37/02
(52) U.S. Cl. ................... 315/307; 315/224; 315/DIG. 4; 310/316; 310/318
(58) Field of Search ................................ 315/209 R, 307, 315/224, DIG. 4; 363/97; 310/316, 318

(56) References Cited

U.S. PATENT DOCUMENTS

| 5,424,935 | 6/1995 | Wu ........................................ 363/97 |
| 5,654,605 | 8/1997 | Kawashima . |
| 5,726,536 | 3/1998 | Hagiwara . |

FOREIGN PATENT DOCUMENTS

| 61-220386A | 9/1986 | (JP) . |
| 5-064436A | 3/1993 | (JP) . |
| 6-167694 | 6/1994 | (JP) . |
| 8-107678 | 4/1996 | (JP) . |
| 8-139382 | 5/1996 | (JP) . |

*Primary Examiner*—David Vu
(74) *Attorney, Agent, or Firm*—Burns, Doane, Swecker & Mathis, LLP

(57) ABSTRACT

In a piezoelectric transformer control circuit for driving a load (2) connected to a piezoelectric transformer (1), an oscillation signal as a basis of driving of the piezoelectric transformer (1) is oscillated, and the piezoelectric transformer (1) is driven by a driving circuit (4) on the basis of the oscillation signal. A pulse power supply circuit (5) for supplying a pulse voltage to the driving circuit (4) intermittently drives the driving circuit (4) by pulse-modulating the pulse voltage to be supplied to the driving circuit (4).

34 Claims, 34 Drawing Sheets

SYSTEM FOR DRIVING A COLD-CATHODE FLUORESCENT LAMP CONNECTED TO A PIEZOELECTRIC TRANSFORMER

TECHNICAL FIELD

The present invention relates to a control circuit and method for a piezoelectric transformer and, more particularly, to a control circuit and method for a piezoelectric transformer suited for use in a driving apparatus for a cold-cathode fluoresent lamp(CCFL).

BACKGROUND ART

Recently, liquid crystal displays are extensively used as display devices of, e.g., portable notebook personal computers. These liquid crystal display devices incorporate a cold-cathode fluoresent lamp as a so-called back light in order to illuminate a liquid crystal display panel from the back. Turning on this cold-cathode fluoresent lamp requires a inverter capable of converting a low DC voltage of a battery or the like into a high AC voltage of 1,000 Vrms or more in an initial lighting state and about 500 Vrms in a steady lighting state. Conventionally, a winding transformer is used as a boosting transformer of this inverter. In recent years, however, a piezoelectric transformer which performs electric conversion via mechanical energy and thereby performs boosting is beginning to be used. This piezoelectric transformer has a generally unpreferable characteristic, i.e., largely changes its boosting ratio in accordance with the magnitude of an output load (load resistance). On the other hand, this dependence upon a load resistance is suited to the characteristics of an inverter power supply for a cold-cathode fluoresent lamp. Accordingly, a piezoelectric transformer has attracted attention as a small-sized, high-voltage power supply meeting the demands for a low profile and a high efficiency of a liquid crystal display device. A basic configuration of a control circuit for this piezoelectric transformer will be described below with reference to FIGS. 1 to 4.

FIG. 1 is a block diagram of a piezoelectric transformer control circuit as the first prior art.

In FIG. 1, reference numeral 101 denotes a piezoelectric transformer; 102, a load such as a cold-cathode fluoresent lamp connected to the output terminal of the piezoelectric transformer 101; 103, an oscillation circuit for oscillating an AC signal such as a rectangular wave; and 104, a driving circuit for driving the piezoelectric transformer 101 in accordance with the oscillation signal from the oscillation circuit 103.

It is generally known that a piezoelectric transformer largely changes the output voltage in the form of a hill in accordance with the frequency of an input AC voltage, the output voltage takes a maximum value when the piezoelectric transformer is driven by its resonance frequency, and the resonance frequency changes in accordance with the temperature or the magnitude (load resistance) of an output load. Accordingly, the general approach is to cause the oscillation circuit 103 to output an oscillation signal equal in frequency to the resonance frequency and drive the piezoelectric transformer 101 by the driving circuit 104 on the basis of this oscillation signal, thereby generating a high voltage at the output terminal of the piezoelectric transformer 101.

In the block diagram of FIG. 1, the driving circuit 104 can have an arrangement as shown in FIG. 2.

FIG. 2 is a block diagram of a piezoelectric transformer control circuit as the second prior art. In FIG. 2, a driving circuit 104 includes a p-type transistor (FET: Field-Effect Transistor) 104a and an n-type transistor (FET) 104b which are so connected as to form a half-bridge circuit. These two transistors (104a and 104b) alternately perform switching in accordance with the state of an output oscillation signal from an oscillation circuit 103. By this switching operation of the driving circuit 104, a driving voltage (AC voltage) whose amplitude is an input voltage Vi is applied to a piezoelectric transformer 101.

In the control circuits having the above configurations, it is necessary to change a lamp current (load current) flowing in a cold-cathode fluoresent lamp connected as the load 102 in order to control the brightness of the cold-cathode fluoresent lamp. To this end, the applied voltage (the output voltage from the piezoelectric transformer 101) to the cold-cathode fluoresent lamp must be adjusted. To adjust the applied voltage, it is necessary to regulate the oscillation signal from the oscillation circuit 103 as the basis of the applied voltage. The area in an ON period of this oscillation signal can be regarded as an energy amount supplied to the piezoelectric transformer 101. Accordingly, the output voltage from the piezoelectric transformer 101 can be changed by changing this energy amount. In conventional piezoelectric transformer control circuits, therefore, the brightness of a cold-cathode fluoresent lamp is controlled by methods as shown in FIGS. 3 and 4.

FIGS. 3 and 4 are timing charts for explaining conventional methods of controlling the brightness of a cold-cathode fluoresent lamp.

In the method shown in FIG. 3, the energy amount supplied from a driving circuit to a piezoelectric transformer is regulated by changing the amplitude of an oscillation signal, and thereby (the amplitude of) an output voltage is adjusted. In the method shown in FIG. 4, as disclosed in, e.g., Japanese Patent Laid-Open No. 5-64437 or 7-220888, a PWM (Pulse Width Modulation) circuit (not shown) is arranged in the control circuit shown in FIG. 1 or 2. In accordance with a signal from this PWM circuit, the duty ratio (Ton/(Ton+Toff)) of an oscillation signal from an oscillation circuit is changed to regulate the energy amount supplied from a driving circuit to a piezoelectric transformer, thereby adjusting (the amplitude of) an output voltage.

Unfortunately, when the brightness of a cold-cathode fluoresent lamp as a load is lowered by dropping the output voltage from a piezoelectric transformer by the above conventional methods, the lighting state becomes unstable if the output voltage from the piezoelectric transformer becomes lower than a voltage necessary to keep the cold-cathode fluoresent lamp discharging. The resultant flickering is of a problem to a human visual sense. Accordingly, adjusting the brightness by the above conventional methods has the problem that a dimming range within which a stable brightness is obtained is narrow.

A piezoelectric transformer control circuit as still another prior art capable of holding the brightness of a cold-cathode fluoresent lamp at a predetermined brightness will be described below with reference to FIGS. 5 to 10.

FIG. 5 is a block diagram of a piezoelectric transformer control circuit as the third prior art.

In FIG. 5, reference numeral 201 denotes a piezoelectric transformer; 202, a load such as a cold-cathode fluoresent lamp connected to the output terminal of the piezoelectric transformer 201; 203, a detecting resistor Rdet for detecting a current flowing in the load; 204, a rectifying circuit for converting an AC voltage generated in the detecting resistor 203 into a DC voltage; 205, an error amplifier for comparing a voltage Vri rectified by the rectifying circuit 204 with a reference voltage Vref and amplifying the difference as a comparison result; 206, a voltage-controlled oscillation circuit for outputting an oscillation signal in accordance with the output voltage from the error amplifier 205; and 207, a driving circuit for driving the piezoelectric transformer 201 in accordance with the oscillation signal from the voltage-controlled oscillation circuit 206. The operation of the control circuit with the above configuration will be described below with reference to FIGS. 6A and 6B.

FIG. 6A is a graph for explaining the relationship between the frequency and the output voltage of a piezoelectric transformer. FIG. 6B is a graph for explaining the relationship between the frequency of a piezoelectric transformer and the load current of a load connected to the piezoelectric transformer.

As shown in FIG. 6A, the piezoelectric transformer 201 has a hilly resonance frequency characteristic whose peak is the resonance frequency of the piezoelectric transformer 201. It is generally known that a current flowing in the load 202 due to the output voltage from the piezoelectric transformer 201 also has a similar hilly characteristic. In FIG. 6B, this load current is represented by a load current detection voltage Vri. Control using a right-side (falling) portion in this characteristic will be described below. When the power supply of this control circuit is turned on, the voltage-controlled oscillation circuit 206 starts oscillating at an initial frequency fa. Since no current flows in the load 202 at that time, the voltage generated in the detecting resistor 203 is zero. Accordingly, the error amplifier 205 outputs a negative voltage, as a result of comparison of the load current detection voltage Vri with the reference voltage Vref, to the voltage-controlled oscillation circuit 206. In accordance with this voltage, the voltage-controlled oscillation circuit 206 shifts the oscillation frequency of an oscillation signal to a lower frequency. Therefore, as the frequency is shifted to a lower frequency, the output voltage from the piezoelectric transformer 201 rises, and the load current (load current detection voltage Vri) also increases. When the load current (load current detection voltage Vri) and the reference voltage Vref become equal to each other, the frequency stabilizes (fb). Even if the resonance frequency changes due to a temperature change or a change with time, the frequency shifts accordingly to always hold the load current substantially constant.

In the control circuit shown in FIG. 5, therefore, frequency control is so performed that the load current detection voltage Vri becomes equal to the reference voltage Vref, and the load current is held at a predetermined value by this frequency control. When a cold-cathode fluoresent lamp is used as a load in this piezoelectric transformer control circuit and the control circuit is used as a lighting device for the cold-cathode fluoresent lamp, a function of holding the brightness of the cold-cathode fluoresent lamp at a predetermined brightness can be achieved since the brightness of the cold-cathode fluoresent lamp is proportional to a lamp current flowing in the cold-cathode fluoresent lamp.

As described above, the control circuit shown in FIG. 5 can hold the lighting state of a cold-cathode fluoresent lamp at a predetermined brightness. In practice, however, a function (dimming function) of changing the brightness is required in addition to the function of holding the lighting state at a predetermined brightness.

FIGS. 7 and 8 show other prior arts. FIG. 7 is a block diagram of a circuit having a function of holding the driving voltage to a piezoelectric transformer substantially constant. FIG. 8 is a block diagram of a circuit having a function of holding the output voltage from a piezoelectric transformer substantially constant. In these circuits, an error amplifier 205 compares a voltage detected by detecting resistors 210a and 210b and a rectifying circuit 204 with a reference voltage. In accordance with the comparison result, the duty ratio of an output rectangular-wave signal from a PWM oscillation circuit 211 which performs so-called PWM (Pulse Width Modulation) is controlled. When the duty ratio of this rectangular-wave signal is controlled, the amplitude of a sine wave contained as a fundamental wave in the rectangular wave can be changed. This enables control for holding the driving voltage or the output voltage at a predetermined value as in the case of the voltage-controlled oscillation circuit 206.

FIG. 9 shows still another prior art in which a lamp current is controlled by adjusting the duty ratio of an output rectangular-wave signal from a PWM oscillation circuit 211. In this control circuit, the lamp current is detected by using a resistor 203. Also, a control circuit shown in FIG. 10 uses the voltage-controlled oscillation circuit 206 explained in FIG. 5, instead of the PWM oscillation circuit 211 in FIG. 8.

Additionally, Japanese Patent Laid-Open No. 8-139382 has proposed a controller for a piezoelectric transformer with a stepped-up output voltage whose waveform is practically regarded as aburst waveform. More practicality, the document is directed cutting the aftershock signal of an output waveform signal of the transformer corresponding to the burst waveform signal. In the document, a method of intermittently operating a half-bridge type driving circuit in accordance with an oscillation signal by using an AND gate circuit has been proposed as a half-bridge type piezoelectric transformer driving circuit related to the control circuit shown in FIG. 2. In this method, however, two transistors connected to form a half-bridge circuit are turned on and off by the same output pulse signal from the AND gate circuit. Accordingly, both the transistors are turned off in the intermittent period of this pulse signal. That is, in the intermittent period of the pulse signal, the driving voltage to a piezoelectric transformer floats from a zero potential to result in an unstable state. Consequently, the output voltage from the piezoelectrictransformer which is supposed to be a zero potential during the period is not necessarily zero. Further, if the cold-cathode fluoresent lamp is driven by the output waveform signal which has been removed of the aftershock (ringing) signal, the life of the cold-cathode fluoresent lamp will be shortened, because the lamp can be damaged by the output waveform signal.

DISCLOSURE OF THE INVENTION

The present invention has been made in consideration of the above situation, and has as its object to provide a control circuit and method for a piezoelectric transformer, which can simultaneously achieve a function of obtaining stable brightness by holding the lamp current (current flowing) of a cold-cathode fluoresent lamp substantially constant and a function of adjusting the brightness by intermittent oscillation.

To achieve the above object, piezoelectric transformer control circuit of the present invention have the following arrangement.

That is, a piezoelectric transformer control circuit for driving a cold-cathode fluoresent lamp connected to a piezoelectric transformer, comprises oscillation means for generating an oscillation signal in accordance with a control voltage, driving means for driving the piezoelectric transformer by an AC voltage generated in accordance with the oscillation signal from the oscillation means, load current detecting means for detecting a current flowing in the cold-cathode fluoresent lamp connected to an output terminal of the piezoelectric transformer, sample-and-hold means for sampling and holding the output from the load current detecting means in accordance with a predetermined control signal, load current error output means for comparing an output from the sample-and-hold means with a predetermined value and outputting the control voltage in accordance with a result of the comparison, and intermittent oscillating means for intermittently driving the driving means by pulse-modulating a pulse signal, for intermittently driving the piezoelectric transformer, to be supplied to the driving means, wherein the sample-and-hold means outputs, to the load current error output means, a held voltage corresponding to the output from the load current detecting means during oscillation period of the intermittent oscillating means when the intermittent oscillating means does not oscillate, and the intermittent oscillating means can adjust a duty ratio of the pulse signal to be generated.

Further, to achieve the above object, piezoelectric transformer control method of the present invention have the following arrangement.

That is, a piezoelectric transformer control method, for driving a cold-cathode fluoresent lamp connected to a piezoelectric transformer, of generating an oscillation signal in accordance with a control voltage and pulse-modulated signal and intermittently driving the piezoelectric transformer by an AC voltage generated in accordance with the oscillation signal, comprises the steps of detecting a current flowing in the cold-cathode fluoresent lamp connected to an output terminal of the piezoelectric transformer and controlling an oscillation frequency of the oscillation signal by controlling the control voltage such that the current flowing is held substantially constant, sampling-and-holding a voltage signal corresponding to the current flowing in accordance with a predetermined control signal, and outputting a held voltage corresponding to the voltage signal during oscillation period of the pulse-modulated signal when the pulse-modulated signal is not oscillated, wherein brightness of the cold-cathode fluoresent lamp can be changed by adjusting a duty ratio of the pulse-modulated signal.

Other features and advantages of the present invention will be apparent from the following description taken in conjunction with the accompanying drawings, in which like reference characters designate the same or similar parts throughout the figures thereof.

BEST MODE FOR CARRYING OUT THE INVENTION

Embodiments of a piezoelectric transformer control circuit according to the present invention will be described in detail below with reference to the accompanying drawings.

[First Embodiment]

The first embodiment of a piezoelectric transformer control circuit according to the present invention will be described below with reference to FIGS. 11 to 17. First, the arrangement of a piezoelectric transformer control circuit of this embodiment will be described.

Figure 11:
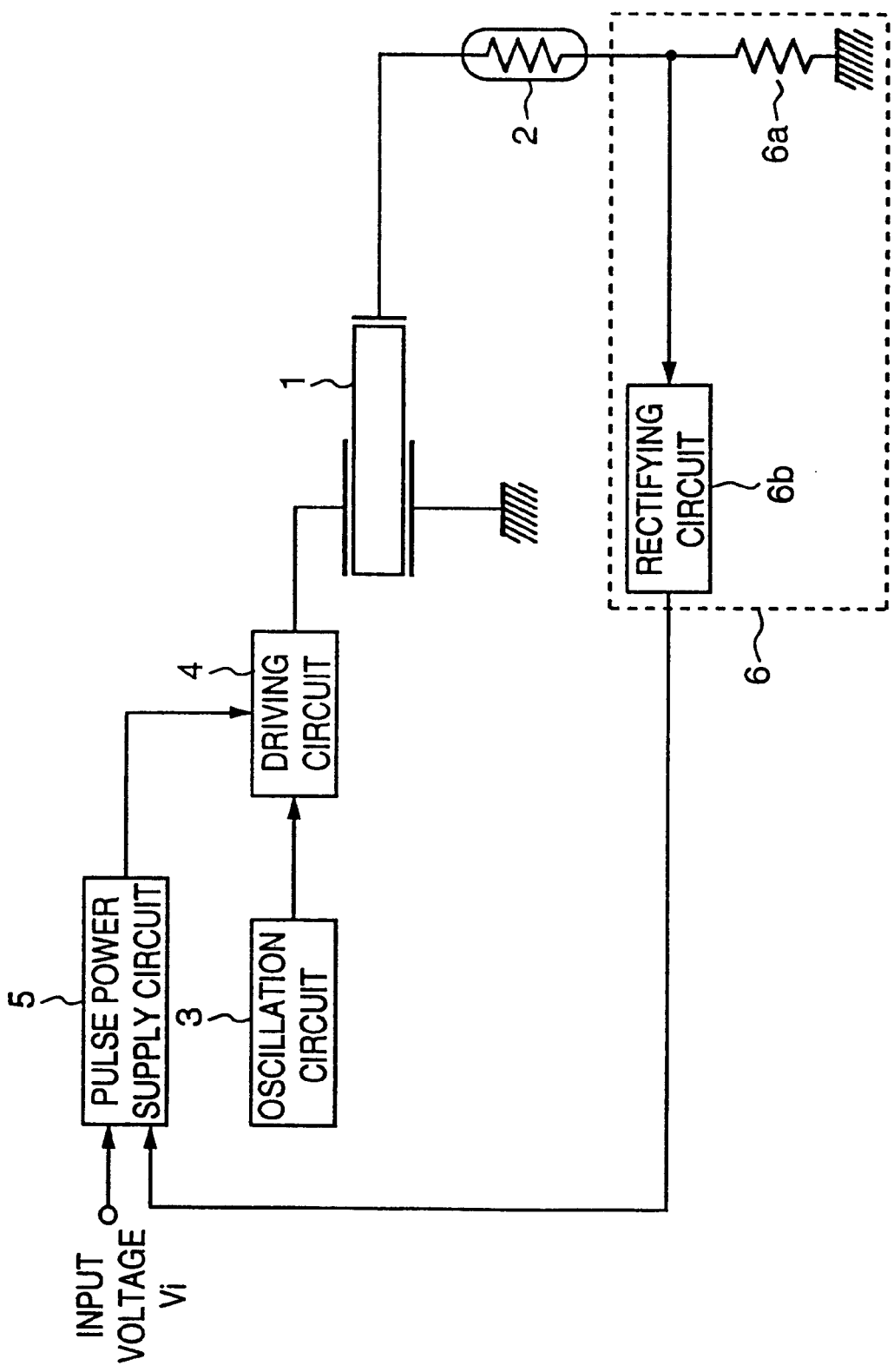
FIG. 11 is a block diagram of a piezoelectric transformer control circuit as the first embodiment of the present invention.

FIG. 11 is a block diagram of a piezoelectric transformer control circuit as the first embodiment of the present invention.

In FIG. 11, reference numeral 1 denotes a piezoelectric transformer; 2, a load such as a cold-cathode fluoresent lamp connected to the output terminal of the piezoelectric transformer 1; 3, an oscillation circuit for oscillating an AC signal such as a rectangular wave; and 4, a driving circuit for driving the piezoelectric transformer 1 in accordance with the oscillation signal from the oscillation circuit 3. These circuits are common as in the prior arts described previously, so a detailed description thereof will be omitted.

Reference numeral 5 denotes a pulse power supply circuit which, in order to change the brightness of the cold-cathode fluoresent lamp, generates a pulse power supply voltage to be supplied to the driving circuit 4 from an input voltage Vi (in this embodiment, −5 V) and controls the pulse width and interval in the pulse power supply voltage (to be described in detail later). Also, the pulse power supply circuit 5 includes a brightness setting means (not shown) for setting a brightness desired by the user. Reference numeral 6 denotes a load current detecting circuit for detecting a load current flowing in the load 2 due to the output voltage from the piezoelectric transformer 1. This load current detecting circuit 6 includes a resistor 6a for detecting the load current as a voltage and a rectifying circuit 6b for rectifying the detection voltage generated in the resistor 6a into a direct current.

The control operations of the control circuit with the above arrangement will be described below with reference to FIGS. 12 and 13.

Figure 12:
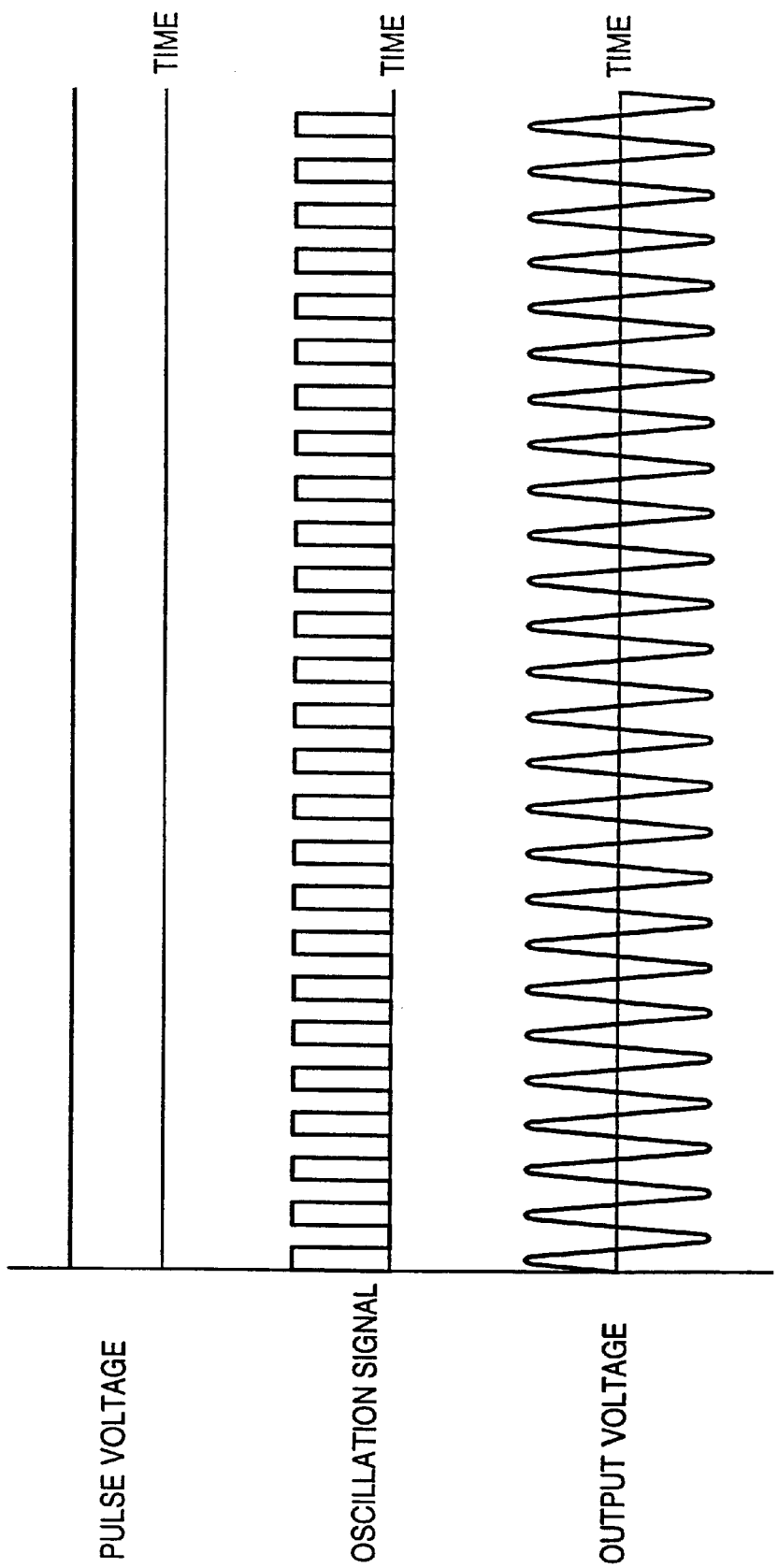
FIG. 12 is a timing chart for explaining the control operation of the control circuit as the first embodiment of the present invention (in the case of a maximum brightness)

FIG. 12 is a timing chart for explaining the control operation of the control circuit as the first embodiment of the present invention (in the case of a maximum brightness).

Figure 13:
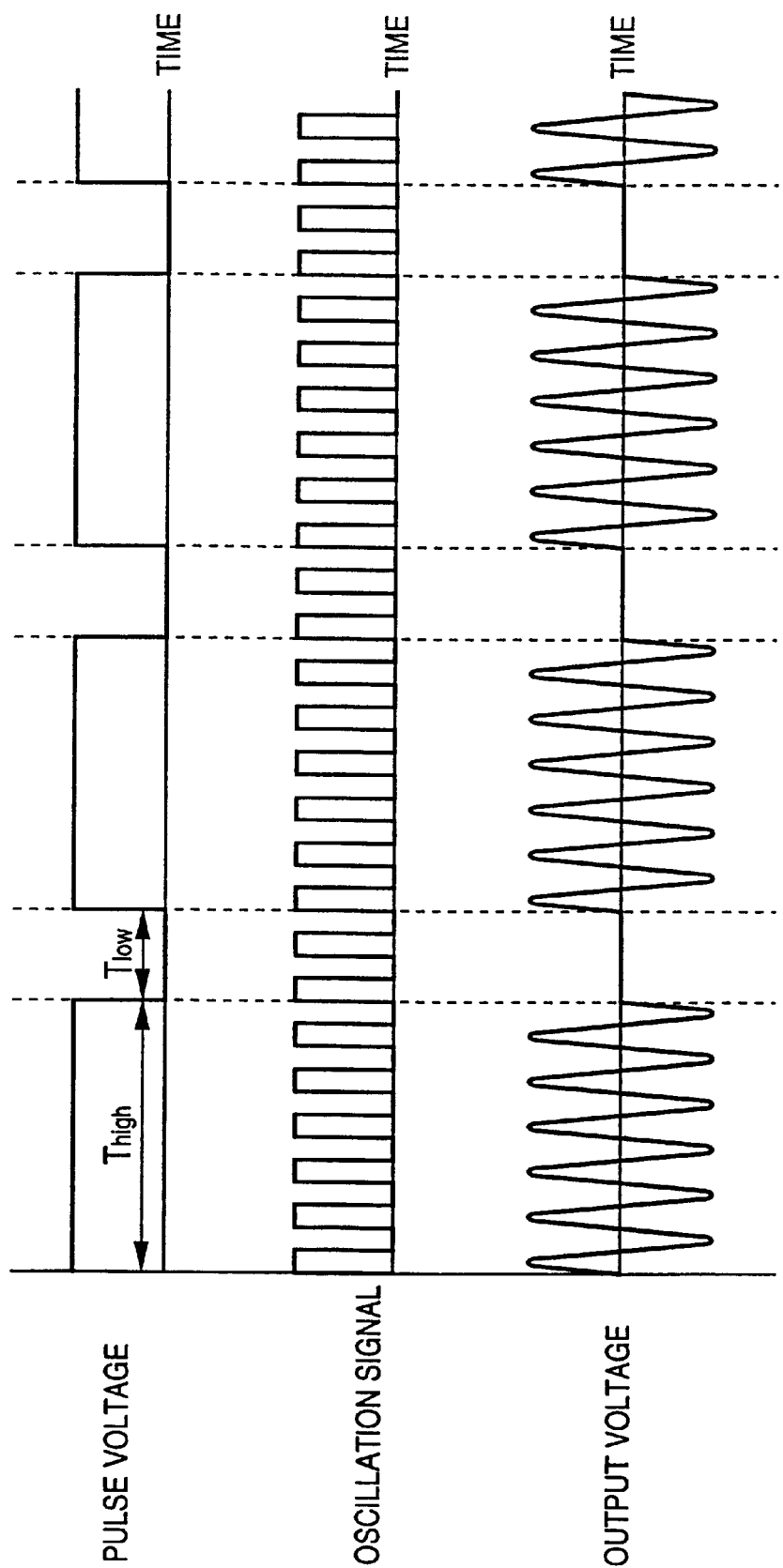
FIG. 13 is a timing chart for explaining the control operation of the control circuit as the first embodiment of the present invention (in the case of dimming)

FIG. 13 is a timing chart for explaining the control operation of the control circuit as the first embodiment of the present invention (in the case of dimming).

In FIGS. 12 and 13, the abscissa indicates time, and the ordinates indicates, from the top, the pulse voltage to be supplied from the pulse power supply circuit 5 to the driving circuit 4, the output oscillation signal from the oscillation circuit 3, and the output voltage from the piezoelectric transformer 1.

FIG. 12 shows a case wherein the cold-cathode fluoresent lamp is turned on at a maximum brightness. The pulse voltage to be supplied from the pulse power supply circuit 5 to the driving circuit 4 is set in a DC state by setting the pulse interval to zero. Since this renders the driving circuit 4 normally ON, the piezoelectric transformer 1 is driven in accordance with the oscillation signal from the oscillation circuit 3 and continuously outputs the output voltage.

In performing dimming so as to decrease the brightness, as shown in FIG. 13, the pulse power supply circuit 5 supplies a pulse driving voltage having a certain pulse interval to the driving circuit 4. Note that a High period (Thigh) of the pulse voltage supplied from the pulse power supply circuit 5 to the driving circuit 4 is much longer than the period of the oscillation signal from the oscillation circuit 3 (e.g., in this embodiment the frequency of the pulse voltage is 1 KHz and the frequency of the oscillation signal is about 100 KHz). As shown in FIG. 13, when the pulse driving voltage is in a Low period (Tlow), the driving circuit 4 does not operate because no voltage is applied to it. Accordingly, the piezoelectric transformer 1 is not driven, and the output voltage is zero. On the other hand, when the pulse voltage is in the High period (Thigh), the voltage is applied to the driving circuit 4 to drive it, so the piezoelectric transformer 1 is also driven to generate the output voltage. When this operation is repeated, the average value of a lamp current (load current) flowing in the cold-cathode fluoresent lamp (load 2) is decreased compared to that in the continuous output state shown in FIG. 12. consequently, the brightness can be lowered. The brightness is further lowered by further prolonging the Low period in the pulse voltage, since the average lamp current flowing in the cold-cathode fluoresent lamp is further decreased. This is so because an after-image in the High period remains to a human visual sense. A practical example of the pulse power supply circuit 5 will be described below with reference to FIG. 14.

Figure 14:
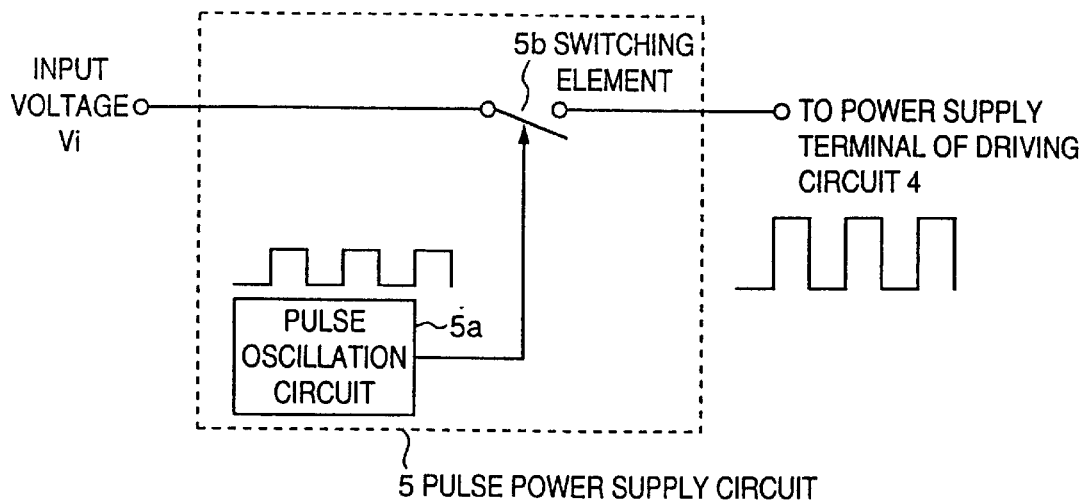
FIG. 14 is a view for explaining the configuration of a pulse power supply circuit as the first embodiment of the present invention.

FIG. 14 is a view for explaining the configuration of the pulse power supply circuit as the first embodiment of the present invention.

Referring to FIG. 14, the pulse power supply circuit 5 outputs the pulse voltage to the driving circuit 4 by causing a switching element 5b to switch on and off the input voltage Vi as a DC voltage in accordance with an output signal from a pulse oscillation circuit 5a. In a preferred embodiment, a MOS-FET (MOS Field-Effect Transistor) can be used as the switching element 5b.

Note that the pulses of the pulse voltage can be adjusted by changing the period of one cycle (Thigh+Tlow) by changing the Low period as described above, or by adjusting the duty ratio while fixing the period of one cycle.

In the dimming operation performed by the above method in this embodiment, as shown in FIG. 11, the load current detected by the load current detecting circuit 6 is fed back to the pulse power supply circuit 5 after being converted into a voltage, and the pulses of the output driving voltage from the pulse power supply circuit 5 are adjusted in accordance with a change in the load current. Therefore, even if the resonance frequency of the piezoelectric transformer 1 changes due to a change in the ambient temperature of the control circuit or the temperature of the piezoelectric transformer 1 itself and the output voltage from the piezoelectric transformer 1 changes accordingly, the cold-cathode fluoresent lamp can be held at a predetermined brightness. In this adjustment operation done by the pulse power supply circuit 5, the desired brightness of the user set by the brightness setting means described above is naturally given priority.

[Effects of First Embodiment]

As described above, the amplitude of the oscillation signal and the amplitude of the driving voltage to be applied to the driving circuit 4 are kept unchanged at respective predetermined values. Therefore, in a period during which the piezoelectric transformer 1 generates an output voltage, this output voltage can be constantly set to a value exceeding the discharge maintaining voltage of the cold-cathode fluoresent lamp. The piezoelectric transformer 1 is made to intermittently generate an output voltage by using a pulse voltage as the power supply voltage of the driving circuit 4 and changing the Low period of this pulse voltage to intermittently drive the driving circuit 4 or by adjusting the duty ratio while fixing the period of one cycle. Consequently, it is possible to hold the cold-cathode fluoresent lamp in a stable lighting state and widen the dimming range.

<First Modification of First Embodiment>

Figure 15:
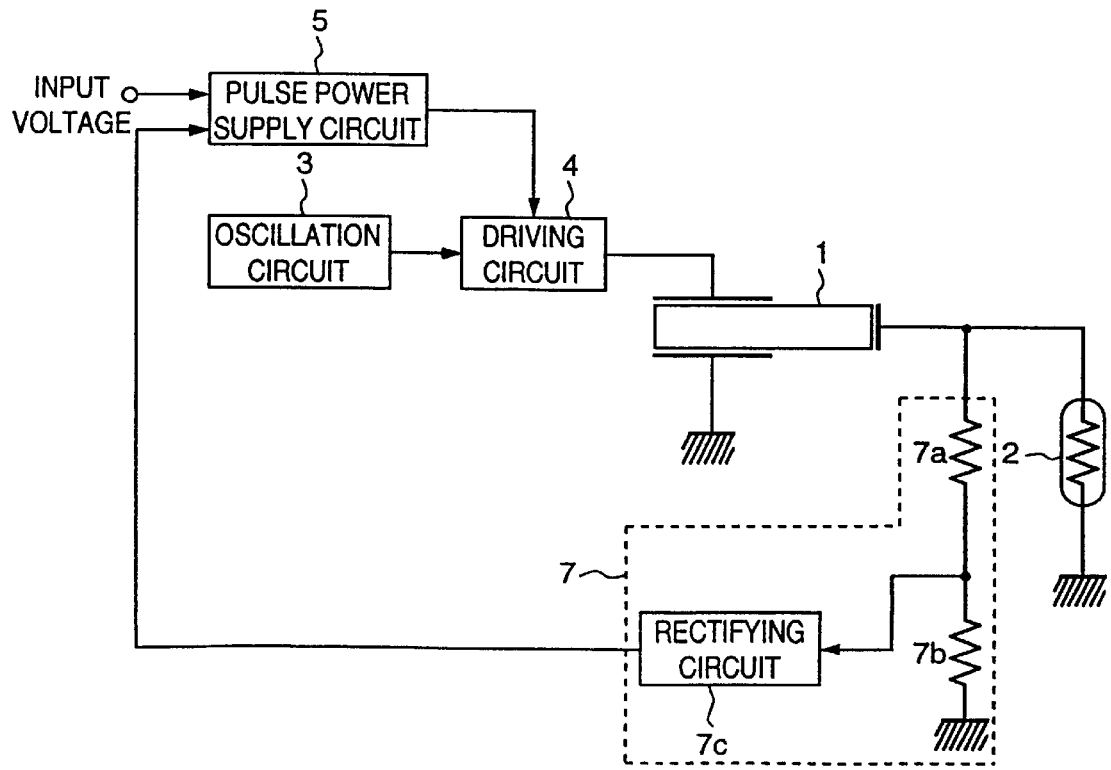
FIG. 15 is a block diagram of a piezoelectric transformer control circuit as the first modification of the first embodiment of the present invention.

FIG. 15 is a block diagram of a piezoelectric transformer control circuit as the first modification of the first embodiment of the present invention.

FIG. 15 differs from the arrangement shown in FIG. 11 in that the control circuit includes an output voltage detecting circuit 7 for detecting an output voltage from the piezoelectric transformer 1, instead of the load current detecting circuit 6. The out-put voltage detecting circuit 7 includes resistors 7a and 7b and a rectifying circuit 7c. The resistors 7a and 7b are connected in parallel with the load 2 between ground and the output terminal of the piezoelectric transformer 7 to extract the output voltage. The rectifying circuit 7c rectifies the output voltage divided by the resistor 7a and 7b into a direct current. The synthetic resistance of the resistors 7a and 7b takes a value of 1 MΩ or more having no influence on the load. An output from this output voltage detecting circuit 7 is fed back to the pulse power supply circuit 5. In accordance with a change in the output, the pulses of the output pulse voltage from the pulse power supply circuit 5 are adjusted. The rest of the arrangement is identical with that shown in FIG. 11, so a detailed description thereof will be omitted.

<Second and Third Modifications of First Embodiment>

If no load is applied on the piezoelectric transformer 1, the output voltage can abruptly increase to destroy the surrounding parts or the piezoelectric transformer itself. Therefore, examples of a control circuit based on the above embodiment and capable of protecting the entire control circuit and the piezoelectric transformer itself from destruction will be described below with reference to FIGS. 16 and 17.

Figure 16:
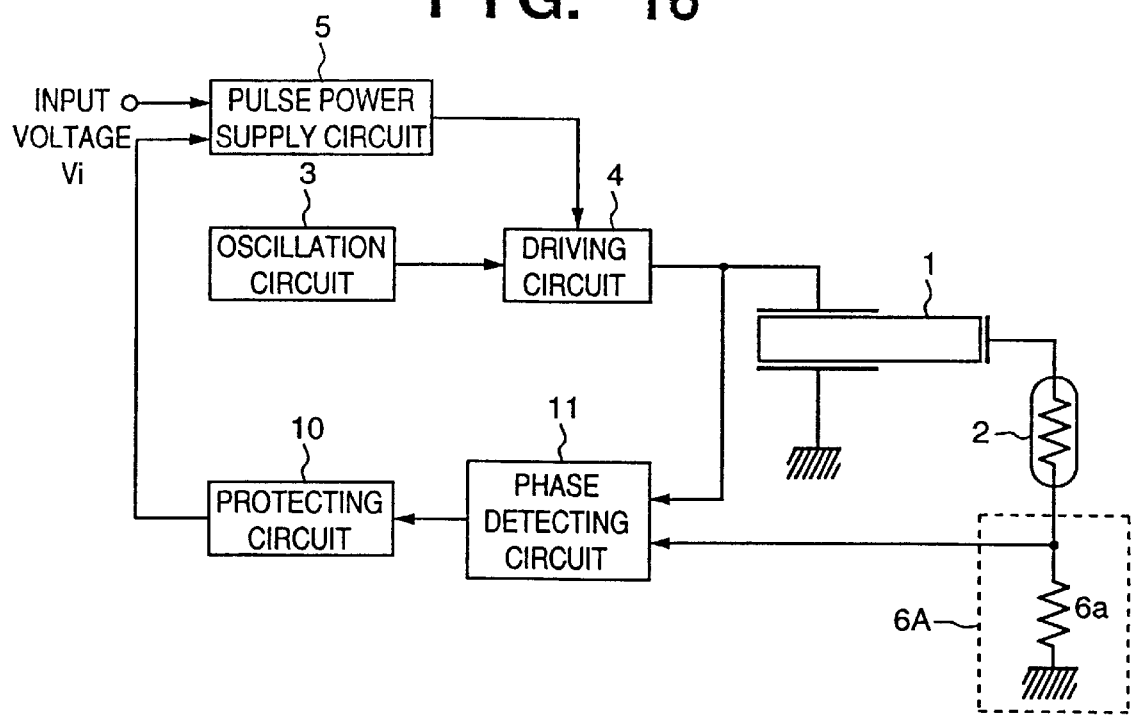
FIG. 16 is a block diagram of a piezoelectric transformer control circuit as the second modification of the first embodiment of the present invention.

FIG. 16 is a block diagram of a piezoelectric transformer control circuit as the second modification of the first embodiment of the present invention.

Figure 17:
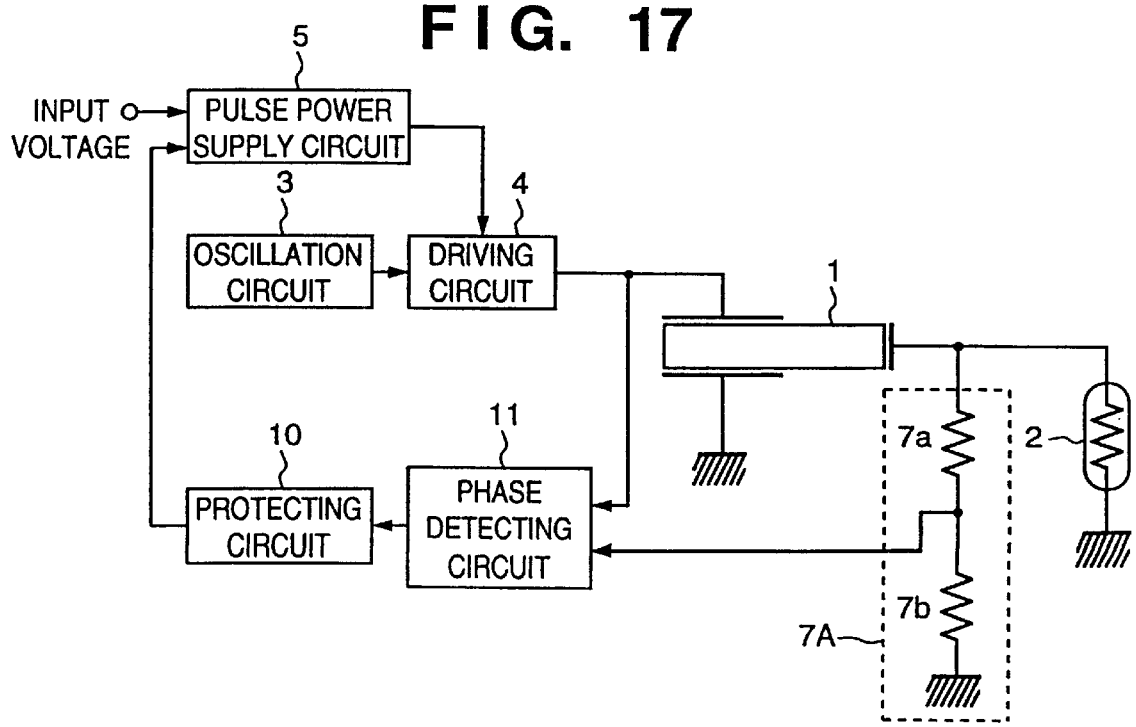
FIG. 17 is a block diagram of a piezoelectric transformer control circuit as the third modification of the first embodiment of the present invention.

FIG. 17 is a block diagram of a piezoelectric transformer control circuit as the third modification of the first embodiment of the present invention.

Referring to FIGS. 16 and 17, the control circuit and the piezoelectric transformer 1 are protected from destruction on the basis of a change in the phase difference between the input voltage from the driving circuit 4 to the piezoelectric transformer 1 and the output voltage from the piezoelectric transformer 1 when the load 2 connected to the piezoelectric transformer 1 is released.

A piezoelectric transformer has a frequency dependence by which the boosting ratio is a maximum at a certain resonance frequency. Generally, a piezoelectric transformer is driven at this resonance frequency to obtain a voltage higher than that at the input terminal of the piezoelectric transformer. If the load 2 connected to the piezoelectric transformer 1 is disconnected or damaged, and the output terminal of the piezoelectric transformer 1 is opened, the boosting ratio increases to produce a very large output voltage. At the same time, the phase difference between the input and output voltages has the characteristic that it changes in accordance with a change in the load 2 at the output terminal of the piezoelectric transformer 1. This change of the phase difference is converted into a detection voltage and applied to a protecting circuit 10 by a phase detecting circuit 11. The protecting circuit 10 compares the input detection voltage with a preset threshold value and performs control in accordance with the comparison result such that the pulse width of the pulse voltage supplied from the pulse power supply circuit 5 becomes zero. Consequently, the whole control circuit and the piezoelectric transformer itself can be protected from destruction. A practical circuit configuration of this phase detecting circuit 11 is as follows. The input and output voltages of the piezoelectric transformer 1 are rectangular waves or sine waves. Therefore, these voltage signals are applied to an EX-OR (EXclusive OR) gate type phase comparator to obtain a voltage corresponding to the phase difference. This voltage is compared with the predetermined threshold value by the comparator. The rest of the arrangement is identical with those shown in FIGS. 11 and 15 (except that the rectifying circuits 6b and 7c are not used because the phase detecting circuit 11 detects a phase), so a detailed description thereof will be omitted.

As described above, this embodiment can provide a piezoelectric transformer control circuit having a wide dimming range of a cold-cathode fluoresent lamp to be driven and capable of obtaining a stable brightness.

[Second Embodiment]

Figure 1:
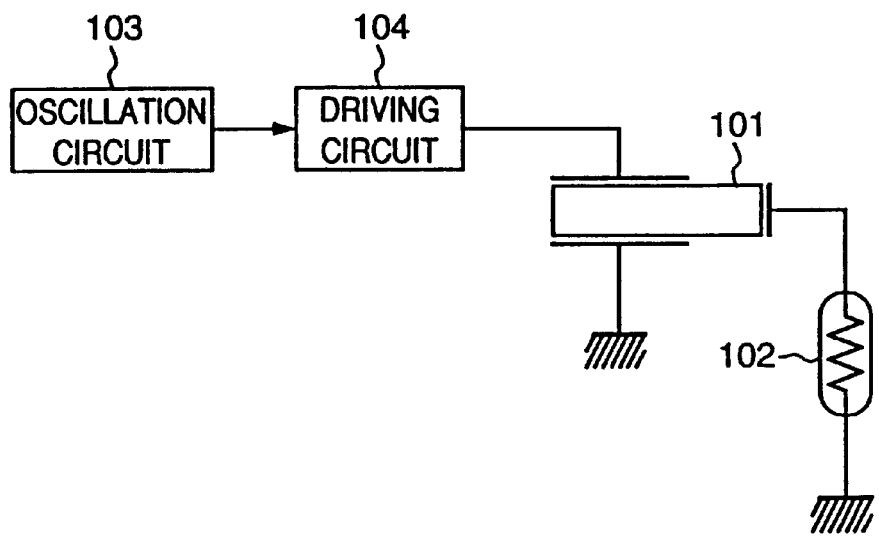
FIG. 1 is a block diagram of a piezoelectric transformer control circuit as the first prior art.
Figure 2:
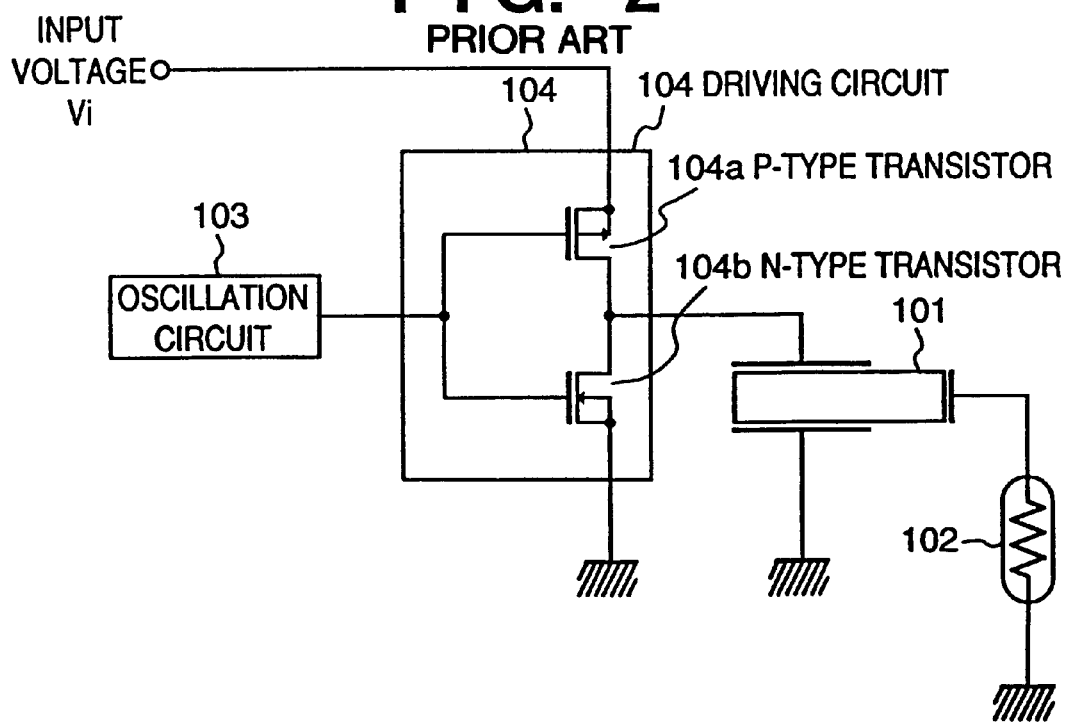
FIG. 2 is a block diagram of a piezoelectric transformer control circuit as the second prior art.
Figure 3:
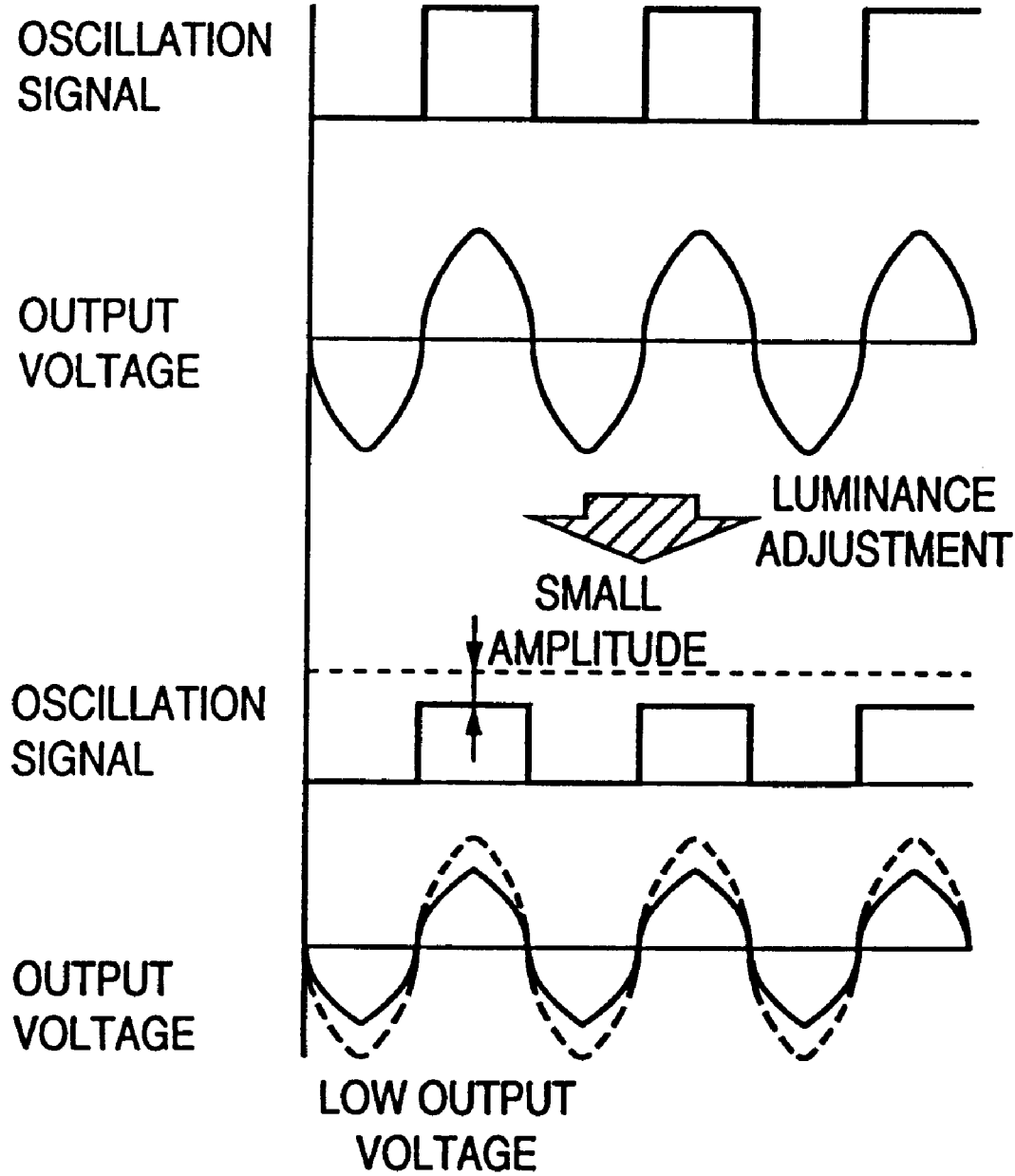
FIG. 3 is a timing chart for explaining a method of controlling the brightness of a cold-cathade fluoresent lamp as a prior art.
Figure 4:
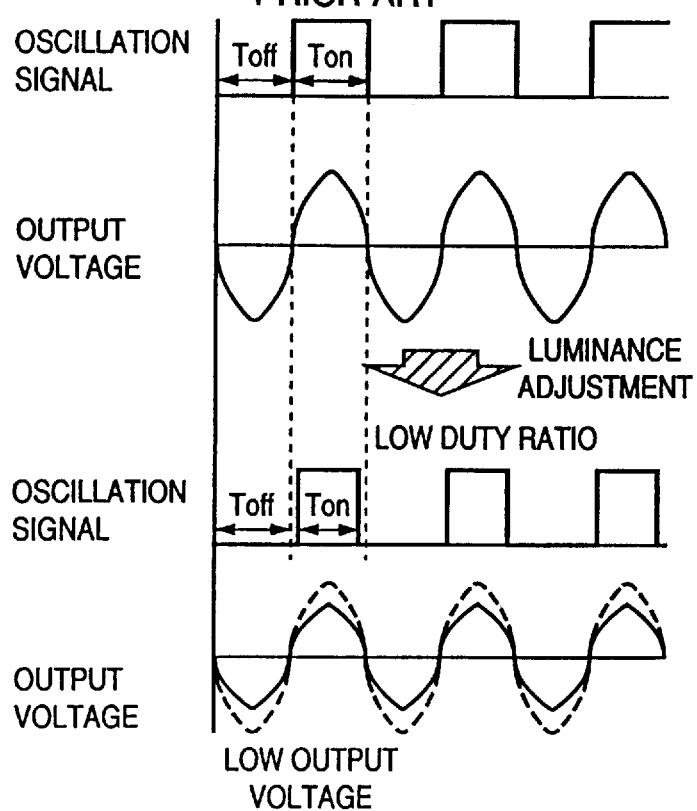
FIG. 4 is a timing chart for explaining a method of controlling the brightness of a cold-cathode fluoresent lamp as a prior art.

The dimming function explained in the first embodiment is also applicable to a control circuit having a driving circuit using transistors shown in FIG. 2.

Figure 18:
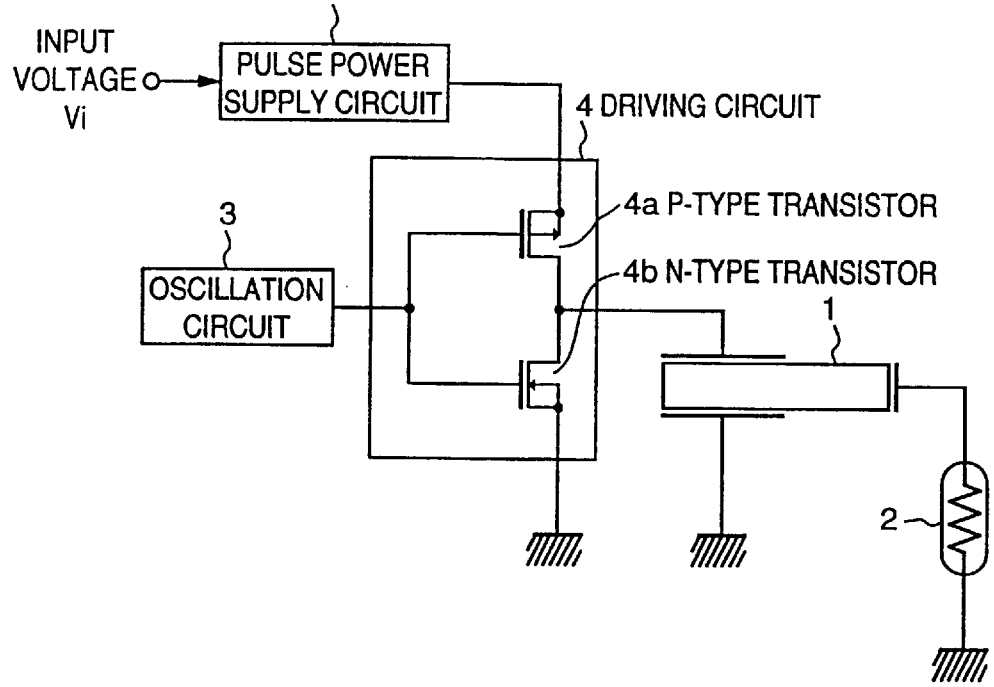
FIG. 18 is a block diagram of a piezoelectric transformer control circuit including a pulse power supply circuit capable of dimming a cold-cathode fluoresent lamp.

FIG. 18 is a block diagram of a piezoelectric transformer control circuit including a pulse power supply circuit capable of dimming a cold-cathode fluoresent lamp. Referring to FIG. 18, a driving circuit 4 includes a p-type transistor (FET: Field-Effect Transistor) 4a and an n-type transistor (FET) 4b which are so connected as to form a half-bridge circuit. These two transistors (4a and 4b) alternately perform switching in accordance with the state of an output oscillation signal from an oscillation circuit 3. By this switching operation of the driving circuit 4, a driving voltage (AC voltage) whose amplitude is an input voltage Vi is applied to a piezoelectric transformer 1. A pulse power supply circuit 5 is similar to the pulse power supply circuit shown in FIG. 14. The driving circuit 4 and the piezoelectric transformer 1 are intermittently driven by an output pulse voltage from the pulse power supply circuit 5. Accordingly, a dimming function is realized by adjusting the switching timing of a switching element 5b in the pulse power supply circuit 5.

In the control circuit shown in FIG. 18, however, switching noise produced by the internal switching element of the pulse power supply circuit 5 is directly superposed on the pulse voltage for driving the piezoelectric transformer 1. Consequently, this switching noise can be transmitted to the piezoelectric transformer 1 via the driving circuit 4.

Also, the ON/OFF characteristic from ON to OFF and the OFF/ON characteristic from OFF to ON of a transistor (FET) are generally different. Therefore, when a circuit configuration such as the driving circuit 4 is used, the time difference between the ON/OFF operations of the individual transistors used can temporarily short-circuit the driving circuit 4 and generate a large unsteady current (noise) in the piezoelectric transformer 1, thereby lowering the efficiency.

In the second embodiment, therefore, a piezoelectric transformer control circuit capable of alleviating the influence of switching noise produced by a switching element used will be described below with reference to FIGS. 19 to 23. First, the configuration of a piezoelectric transformer control circuit according to the present invention will be described.

Figure 19:
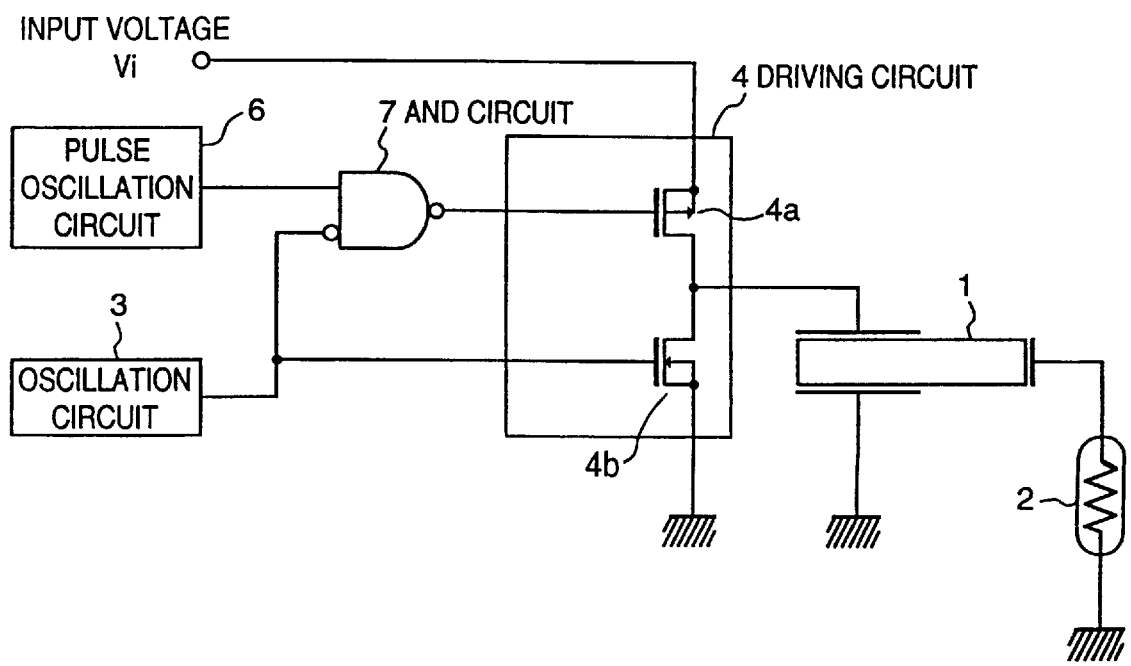
FIG. 19 is a block diagram of a piezoelectric transformer control circuit as the second embodiment of the present invention.

FIG. 19 is a block diagram of a piezoelectric transformer control circuit as the second embodiment of the present invention.

In FIG. 19, reference numeral 1 denotes the piezoelectric transformer; 2, a load such as a cold-cathode fluorescent lamp connected to the output terminal of the piezoelectric transformer 1; 3, the oscillation circuit for oscillating an AC signal such as a rectangular wave; and 4, the half-bridge type driving circuit for driving the piezoelectric transformer 1 in accordance with the oscillation signal from the oscillation circuit 3. These circuits are common as in the prior arts described earlier, so a detailed description thereof will be omitted.

Reference numeral 6 denotes a pulse oscillation circuit which generates a pulse signal for changing the brightness of the cold-cathode fluoresent lamp, and also controls the pulse width and interval of the pulse signal; and 7, an AND circuit for generating the gate signal of a transistor 4a on the high side from the logical product of the pulse signal from the pulse oscillation circuit 6 and the oscillation signal from the oscillation circuit 3.

The operation of the control circuit with the above arrangement will be described below with reference to FIG. 20.

Figure 20:
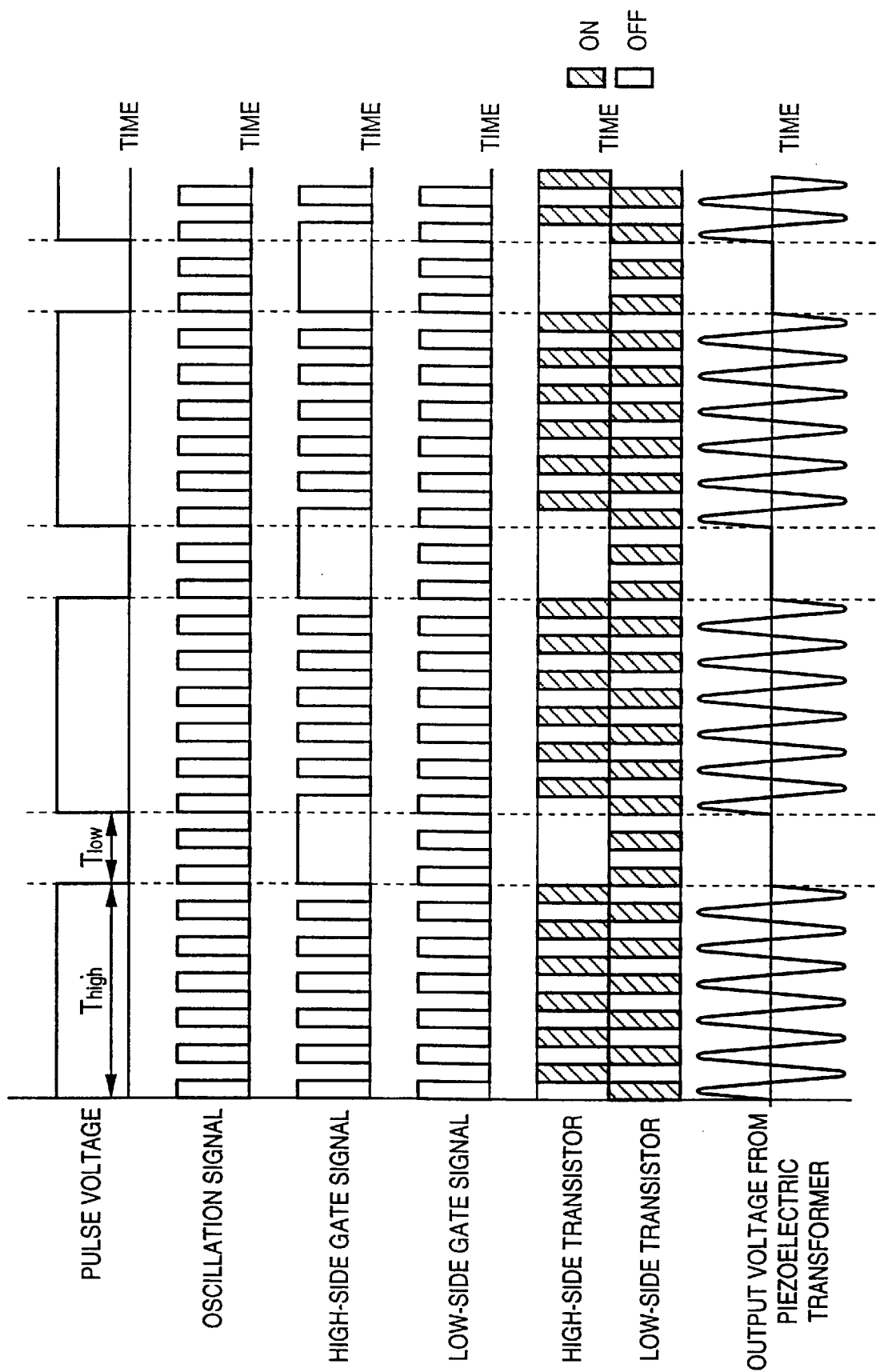
FIG. 20 is a timing chart for explaining the operation of the control circuit as the second embodiment of the present invention.

FIG. 20 is a timing chart for explaining the operation of the piezoelectric transformer control circuit as the second embodiment of the present invention.

Referring to FIG. 20, the abscissa indicates time, and the ordinate indicates, from the top, the output pulse signal from the pulse oscillation circuit 6, the output oscillation signal from the oscillation circuit 3, the gate signal of the transistor 4a on the high side, the gate signal of a transistor 4b on the low side, the operating states of the transistors on the high and low sides, and the output voltage from the piezoelectric transformer 1. Note that the frequency of the oscillation signal is much higher than the frequency of the pulse signal.

The output oscillation signal from the oscillation circuit 3 is constantly applied as the gate signal to the transistor 4b on the low side. Therefore, the transistor 4b on the low side is constantly turned on and off in accordance with the period of the oscillation signal from the oscillation circuit 3. On the other hand, the transistor 4a on the high side receives, as the gate signal, an inverted signal of a comb signal as the logical product of the pulse signal from the pulse oscillation circuit 6 and an inverted signal of the oscillation signal from the oscillation circuit 3. Accordingly, the transistor 4a on the high side is turned on only in a low period of the oscillation signal during a high period of the pulse signal, and turned off in the remaining period. That is, the transistor 4a on the high side is used in both the switching operation done by the driving circuit 4 to generate an AC voltage for driving the piezoelectric transformer 1 and the operation of intermittently turning on and off the output AC voltage from the driving circuit 4. Therefore, as in the control circuit shown in FIG. 18, the brightness of the cold-cathode fluoresent lamp (load 2) can be adjusted in a stable lighting state by intermittently driving the piezoelectric transformer 1 and controlling the length (duty ratio) of the high or low period of the pulse signal.

<First Modification of Second Embodiment>

Figure 21:
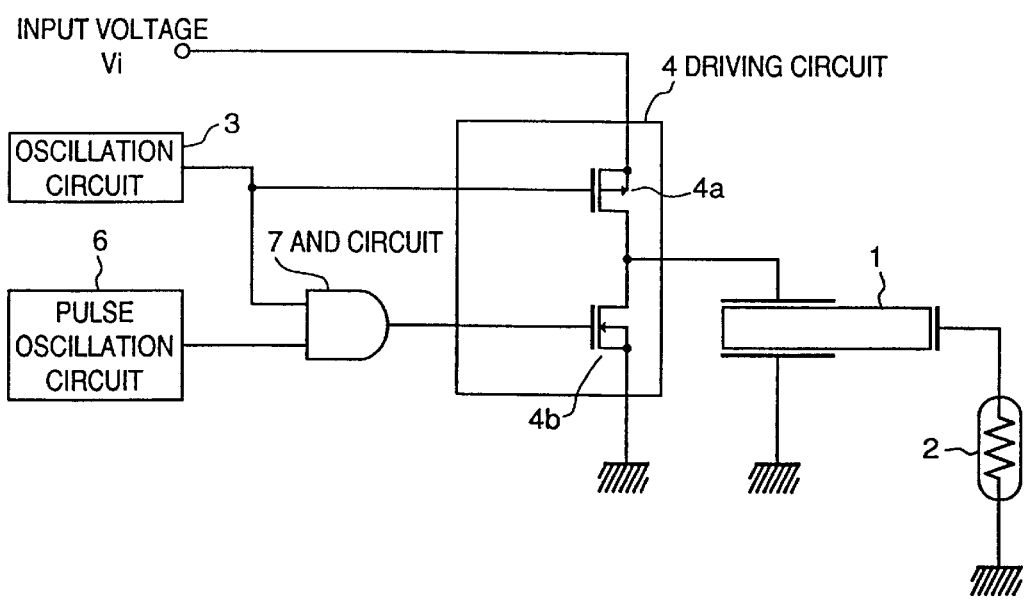
FIG. 21 is a block diagram of a piezoelectric transformer control circuit as the first modification of the second embodiment of the present invention.

FIG. 21 is a block diagram of a piezoelectric transformer control circuit as the first modification of the second embodiment of the present invention. FIG. 21 differs from the configuration shown in FIG. 19 in that the AND signal of the pulse signal from the pulse oscillation circuit 6 and the oscillation signal from the oscillation circuit 3 is applied as the gate signal of the transistor 4b on the low side. That is, except that the operations of the transistors on the high and low sides are opposite to those described above, FIG. 21 is identical with the control circuit-shown in FIG. 19 in that the cold-cathode fluoresent lamp can be dimmed by intermittently driving the piezoelectric transformer 1. Accordingly, the same reference numerals as in FIG. 19 denote the same parts in FIG. 21, and a detailed description thereof will be omitted.

[Effects of Second Embodiment]

The AND signal of the pulse signal from the pulse oscillation circuit 6 and the oscillation signal from the oscillation circuit 3 is applied as the gate signal of the transistor on the high side (FIG. 19) or the low side (FIG. 21)

in the driving circuit 4. Consequently, this transistor serves as both a switching element for generating a piezoelectric transformer driving AC voltage in the pulse power supply circuit 5 and a switching transistor of the driving circuit 4. Accordingly, the intermittent operation is realized by the line of the switching transistor of the driving circuit 4 through which a current much smaller than a current flowing through the input voltage line flows. This reduces causes of switching noise to the piezoelectric transformer 1. The piezoelectric transformer 1 can also be intermittently driven as in the control circuit shown in FIG. 18. Therefore, the brightness of the cold-cathode fluoresent lamp (load 2) can be adjusted in a stable lighting state.

Additionally, the transistors on the high and low sides are not operated by a common gate signal unlike in the control circuit shown in FIG. 18; i.e., the transistors 4a and 4b are operated by the respective individual gate signals, and one of these transistors (in FIG. 19, the transistor 4b on the low side) is constantly turned on and off even in the period Tlow of the pulse signal. Accordingly, a time during which both of the two transistors are turned off in the period Tlow of the pulse signal is reduced to ½ that in the circuit shown in FIG. 18. Consequently, it is possible to reduce an unstable time during which the driving voltage of the piezoelectric transformer floats from a zero potential.

<Second Modification of Second Embodiment>

Figure 22:
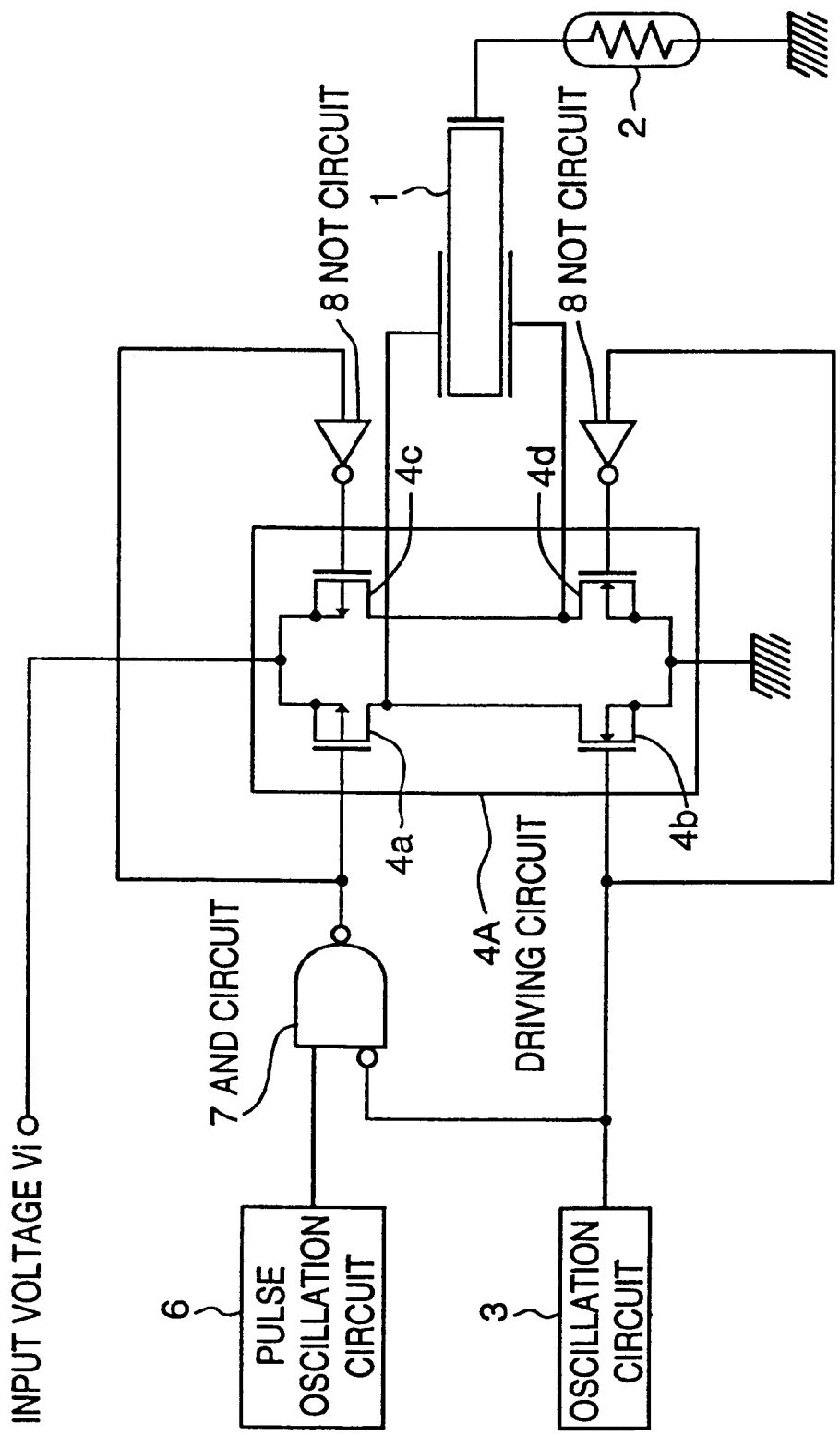
FIG. 22 is a block diagram of a piezoelectric transformer control circuit as the second modification of the second embodiment of the present invention.

FIG. 22 is a block diagram of a piezoelectric transformer control circuit as the second modification of the second embodiment of the present invention. FIG. 22 differs from the circuit configuration shown in FIG. 19 in that a driving circuit 4A is formed into a full-bridge circuit by the transistors 4a and 4b and transistors 4c and 4d as shown in FIG. 22 and NOT circuits (inverters) 8 are connected to the inputs of the transistors 4c and 4d. The switching operation of the full-bridge type driving circuit 4A in which the transistors 4a and 4c and the transistors 4b and 4d are alternately turned on and off is known to those skilled in the art and a detailed description thereof will be omitted. In this modification, the transistors 4b and 4d are constantly repeatedly turned on and off by the oscillation signal from the oscillation circuit 3, and the transistors 4a and 4c are intermittently turned on and off. However, this modification is identical with FIG. 19 in that the cold-cathode fluoresent lamp can be dimmed by intermittently driving the piezoelectric transformer 1. Therefore, the same reference numerals as in FIG. 19 denote the same parts in FIG. 22, and a detailed description thereof will be omitted.

<Third Modification of Second Embodiment>

Figure 23:
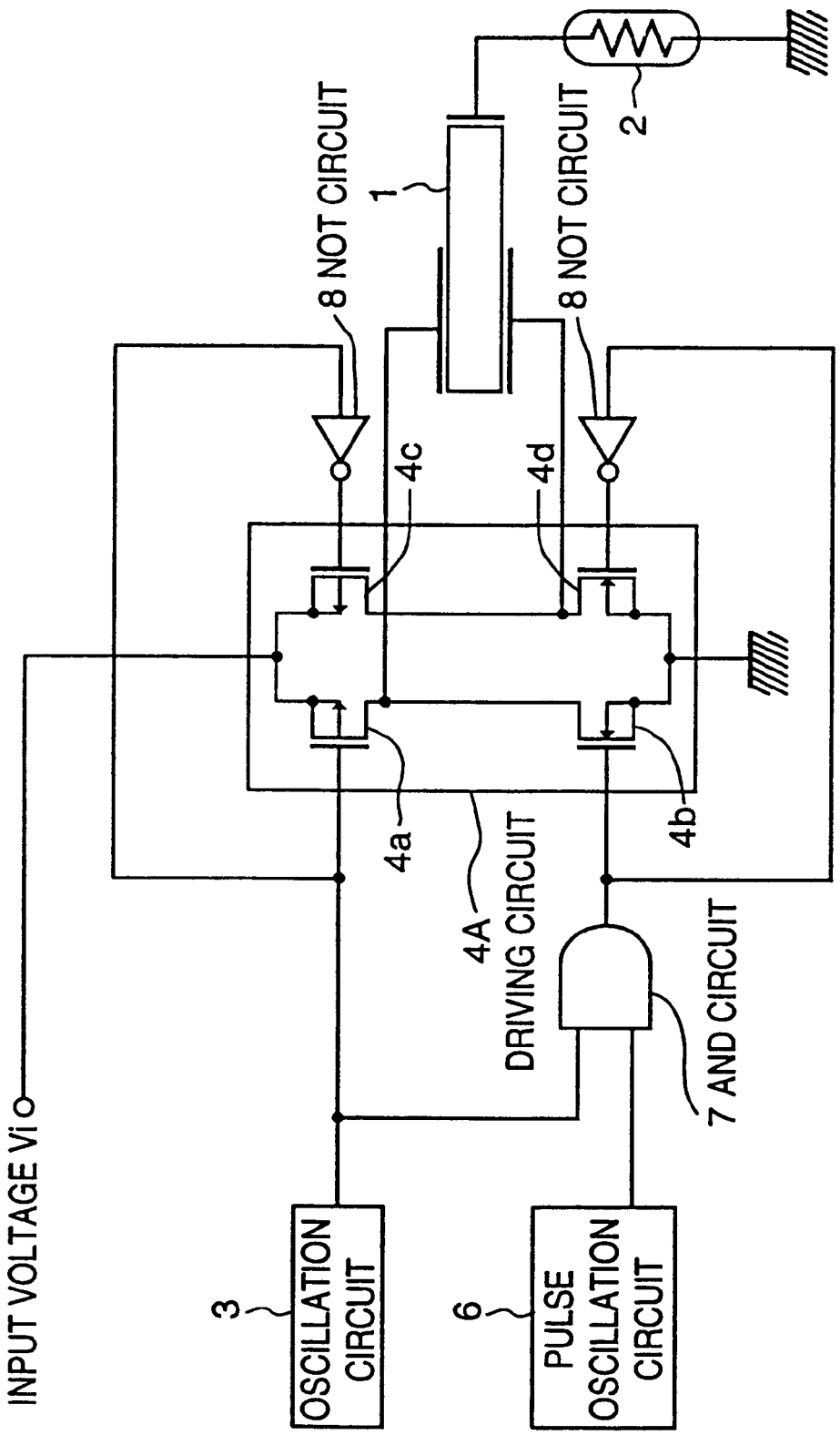
FIG. 23 is a block diagram of a piezoelectric transformer control circuit as the third modification of the second embodiment of the present invention.

FIG. 23 is a block diagram of a piezoelectric transformer control circuit as the third modification of the second embodiment of the present invention. Referring to FIG. 23, the half-bridge type driving circuit shown in FIG. 21 is changed into a full-bridge circuit. In this modification, the transistors 4a and 4c are constantly repeatedly turned on and off by the oscillation signal from the oscillation circuit 3, and the transistors 4b and 4d are intermittently turned on and off. The rest of the operation is the same as the second modification (FIG. 22) described above. That is, this modification is identical with FIG. 22 in that the cold-cathode fluoresent lamp can be dimmed by intermittently driving the piezoelectric transformer 1. Therefore, the same reference numerals as in FIG. 22 denote the same parts in FIG. 23, and a detailed description thereof will be omitted.

As described above, this embodiment can provide a piezoelectric transformer control circuit capable of alleviating the influence of switching noise generated by a switching element used.

[Third Embodiment]

Figure 5:
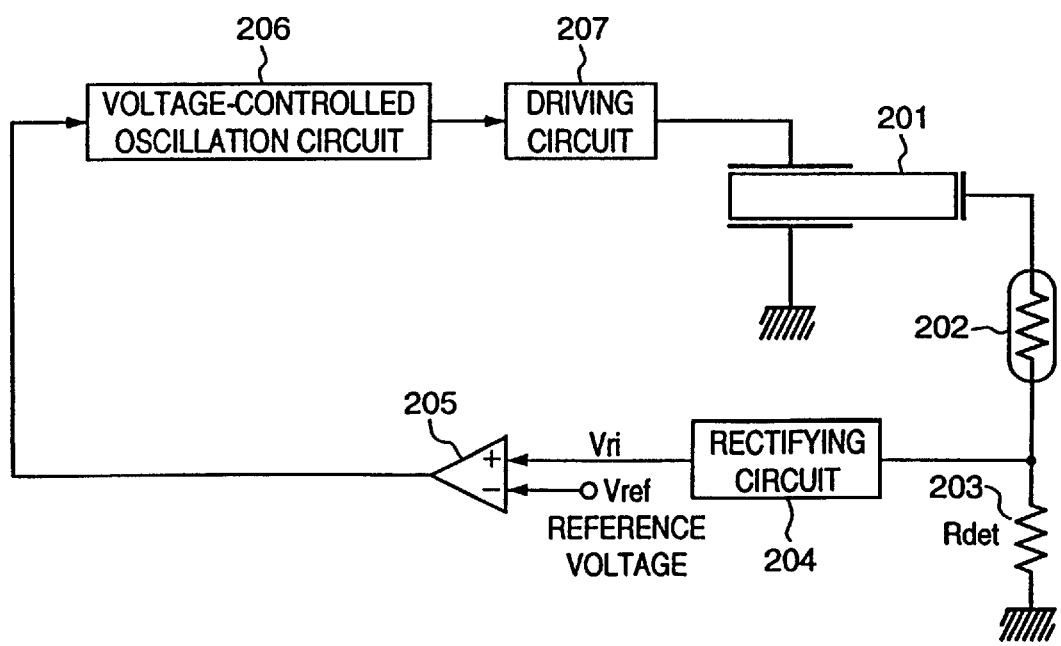
FIG. 5 is a block diagram of a piezoelectric transformer control circuit as the third prior art.

Consider a case wherein the circuit for performing intermittent oscillation explained in the first embodiment is incorporated into the piezoelectric transformer control circuit shown in FIG. 5. In this case, if the average lamp current is reduced by intermittent oscillation in order to perform dimming, the load current detection voltage Vri becomes lower than the reference voltage Vref. Consequently, the oscillation frequency of the voltage-controlled oscillation circuit 206 shifts to a lower frequency, and the driving circuit 207 functions to increase the lamp current. Eventually, the average lamp current remains unchanged. That is, the "dimming function" do not function any longer due to the "function of holding the lamp current substantially constant" that the piezoelectric transformer control circuit shown in FIG. 5 has.

Analogously, when the circuit for performing intermittent oscillation is incorporated into the circuits shown in FIGS. 7 to 10, no preferable control can be obtained because the "dimming function" do not function any longer due to the "function of holding the lamp current, the driving voltage, or the output voltage substantially constant".

In the third embodiment, therefore, a piezoelectric transformer control circuit capable of simultaneously achieving the function of holding the lamp current of a cold-cathode fluoresent lamp as a load, the driving voltage, or the output voltage substantially constant and the function of adjusting the brightness by intermittent oscillation will be described below with reference to FIGS. 24 to 31.

Figure 24:
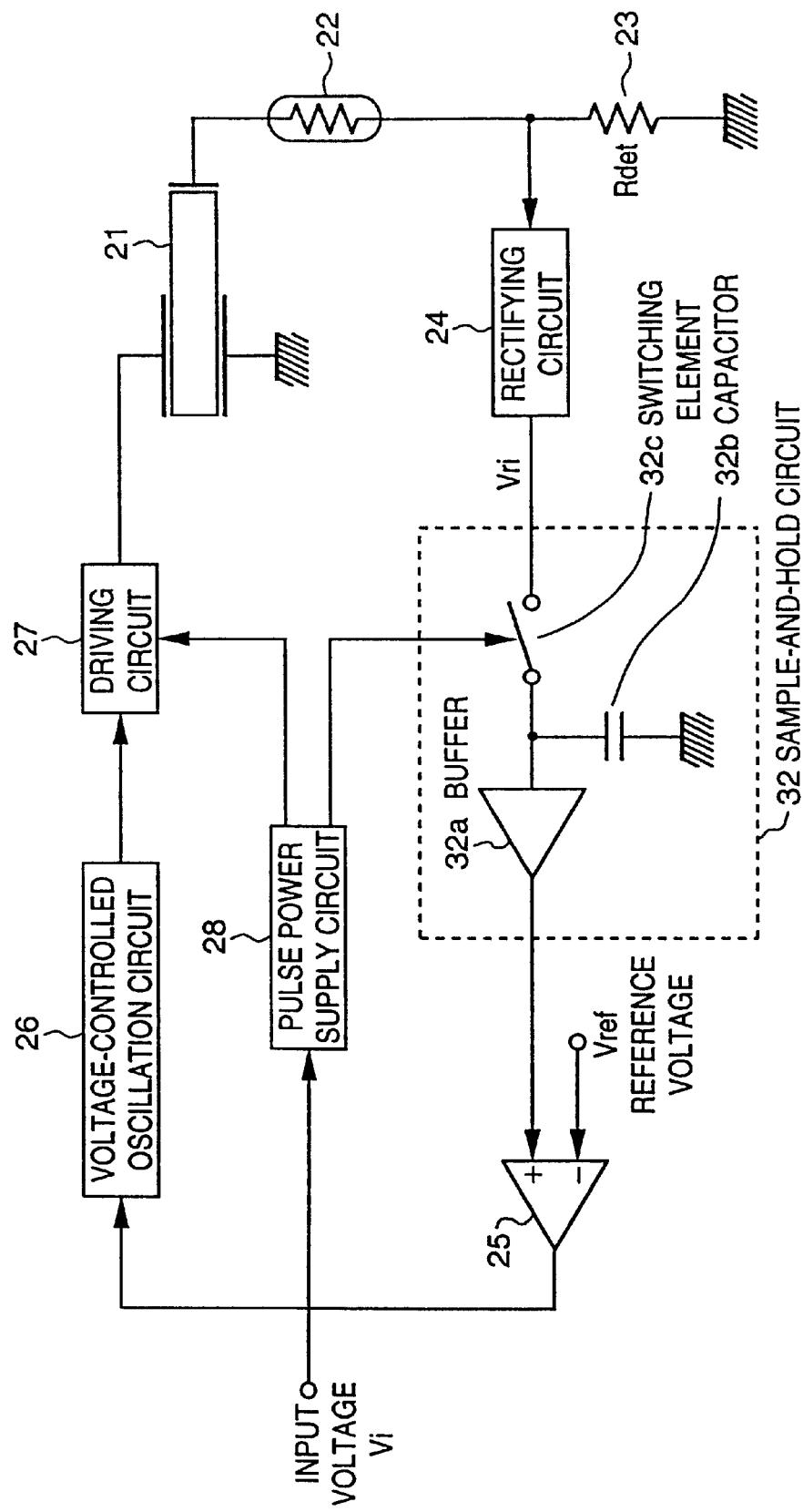
FIG. 24 is a block diagram of a piezoelectric transformer control circuit as the third embodiment of the present invention.

FIG. 24 is a block diagram of a piezoelectric transformer control circuit as the third embodiment of the present invention.

In FIG. 24, reference numeral 21 denotes a piezoelectric transformer; 22, a load such as a cold-cathode fluoresent lamp connected to the output terminal of the piezoelectric transformer 21; 23, a detecting resistor Rdet for detecting a current flowing in the load; 24, a rectifying circuit for rectifying an AC voltage generated in the detecting resistor 23 into a DC voltage; 32, a sample-and-hold circuit for sampling and holding an output voltage (to be referred to as a load current detection voltage Vri hereinafter) from the rectifying circuit 24 in accordance with a signal from a pulse power supply circuit 28; 25, an error amplifier for comparing an output voltage from the sample-and-hold circuit 32 with a reference voltage Vref and amplifying the difference; 26, a voltage-controlled oscillation circuit for outputting an oscillation signal in accordance with an output from the error amplifier 25; and 27, a driving circuit for driving the piezoelectric transformer 21 in accordance with the oscillation signal from the voltage-controlled oscillation circuit 26. To change the brightness of the cold-cathode fluoresent lamp (load 22), the pulse power supply circuit 28 generates a pulse power supply voltage to be supplied to the driving circuit 27 from an input voltage Vi and also controls the pulse width and interval in the pulse power supply voltage.

As shown in FIG. 24, the sample-and-hold circuit 32 includes a buffer 32a, a charging capacitor 32b, and a switching element 32c.

Figure 25:
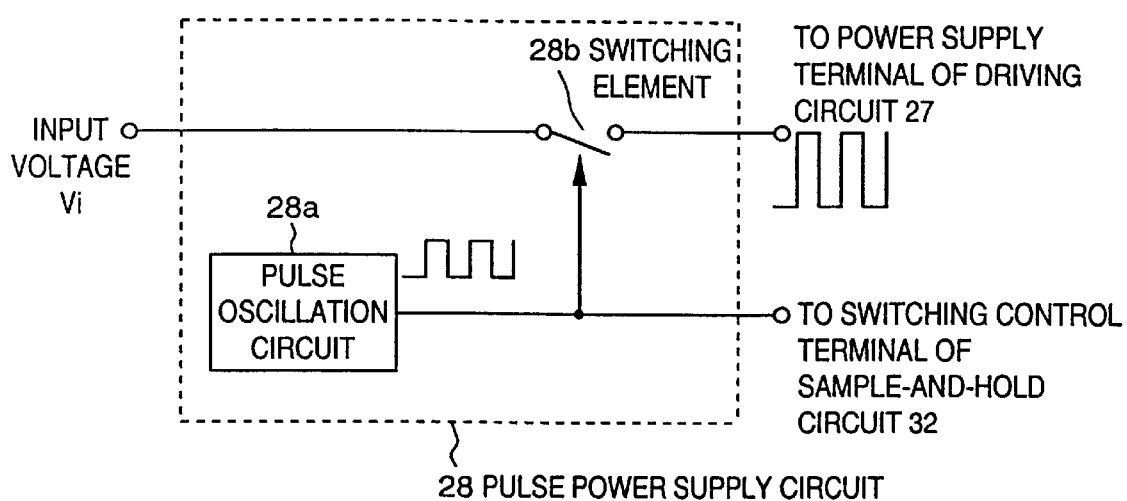
FIG. 25 is a view for explaining the configuration of a pulse power supply circuit as the third embodiment of the present invention.

FIG. 25 is a view for explaining the configuration of the pulse power supply circuit as the third embodiment of the present invention.

Referring to FIG. 25, the pulse power supply circuit 28 outputs the pulse voltage to the driving circuit 27 by causing a switching element 28b, e.g., a MOS-FET (MOS Field-Effect Transistor), to switch on and off an input voltage Vi as a DC voltage in accordance with an output signal from a pulse oscillation circuit 28a. The output signal from the pulse oscillation circuit 28a is also supplied to the switching element 32c of the sample-and-hold circuit 32. Accordingly, the switching rates of the switching elements 28b and 32c are controlled by the output signal from the pulse oscillation circuit 28a.

The operation of the piezoelectric transformer control circuit with the above arrangement will be described below.

To maximize the brightness, the pulse power supply voltage supplied from the pulse power supply circuit 28 becomes a continuous DC voltage, and the switching element 32c is normally closed in the sample-and-hold circuit 32. This is equivalent to the absence of the sample-and-hold circuit 32. Therefore, the control is the same as that of the circuit previously explained with reference to FIG. 5, so a detailed description thereof will be omitted.

An operation in which, in order to lower the brightness, the pulse oscillation circuit 28a is adjusted, the pulse power supply voltage is supplied from the pulse power supply circuit 28 to the driving circuit 27, and the piezoelectric transformer 21 is intermittently driven will be described next.

When the switching element 28b in the pulse power supply circuit 28 is closed and the voltage Vi is supplied to the driving circuit 24, the piezoelectric transformer 21 is driven by the driving voltage from the driving circuit 27, and a lamp current flows in the cold-cathode fluoresent lamp (oscillation period). At this time, the signal from the pulse oscillation circuit 28a in the pulse power supply circuit is applied to the control terminal of the switching element 32c in the sample-and-hold circuit 32. Therefore, the switching element 32c is closed similarly to the switching element 28b in the pulse power supply circuit 28. Consequently, the charging capacitor 32b is charged with the load current detection voltage Vri detected by the detecting resistor 23 and the rectifying circuit 24, and the voltage Vri is also output to the error amplifier 25 via the buffer 32a. Accordingly, the error amplifier 25 outputs a voltage corresponding to the difference between the load current detection voltage Vri and the reference voltage Vref. As a consequence, the piezoelectric transformer 21 is driven.

When the switching element 28b in the pulse power supply circuit 28 is open and no voltage is applied to the driving circuit 24, the piezoelectric transformer 21 is not driven, so no lamp current flows in the cold-cathode fluoresent lamp (idle period). At this time, the switching element 32c in the sample-and-hold circuit 32 is open. Therefore, the voltage charged in the charging capacitor 32b in the sample-and-hold circuit 32 while the switching element 32c is closed, i.e., the load current detection voltage Vri during the ON period is output to the error amplifier 25 without being influenced by the load current detection voltage Vri from the rectifying circuit 24.

Accordingly, even in this idle period, it is possible to control the oscillation frequency by using the voltage charged by the load current detection voltage Vri during the oscillation period. Consequently, the driving state of the piezoelectric transformer 21 in the oscillation period is held. Additionally, when Thigh or Tlow is changed by adjusting the pulse oscillation circuit 28a in order to dim the cold-cathode fluoresent lamp, the average lamp current can be changed. As a consequence, the brightness of the cold-cathode fluoresent lamp can also be changed.

[Effects of Third Embodiment]

When the piezoelectric transformer is intermittently driven in order to dim the cold-cathode fluoresent lamp, the voltage to the voltage-controlled oscillation circuit, which is equivalent to the lamp current during the oscillation period, can be held under the control of the sample-and-hold circuit. Therefore, even in the idle period the driving state of the driving circuit during the oscillation period can be held. Additionally, the brightness of the cold-cathode fluoresent lamp can be adjusted because the average lamp current can be adjusted by changing the length of the oscillation period or the idle period.

<Modifications of Third Embodiment>

FIGS. 26 to 29 are block diagrams of piezoelectric transformer control circuits as the first to fourth modifications of the third embodiment of the present invention.

Figure 26:
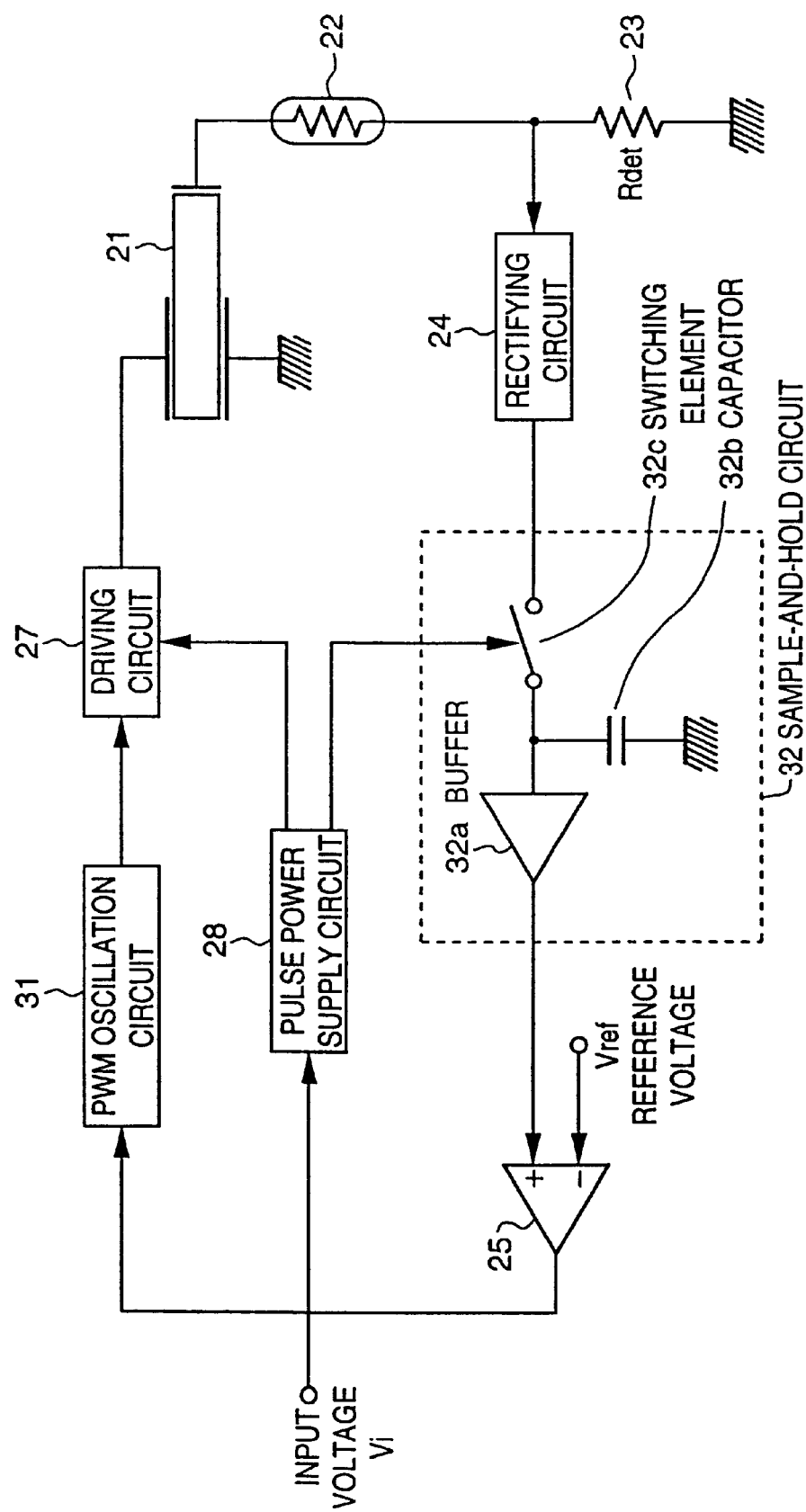
FIG. 26 is a block diagram of a piezoelectric transformer control circuit as the first modification of the third embodiment of the present invention.

First, as shown in FIG. 26, the lamp current can naturally be held at the value in the oscillation period by using a PWM oscillation circuit 31, instead of the voltage-controlled oscillation circuit 26 in the above embodiment (FIG. 24).

Figure 27:
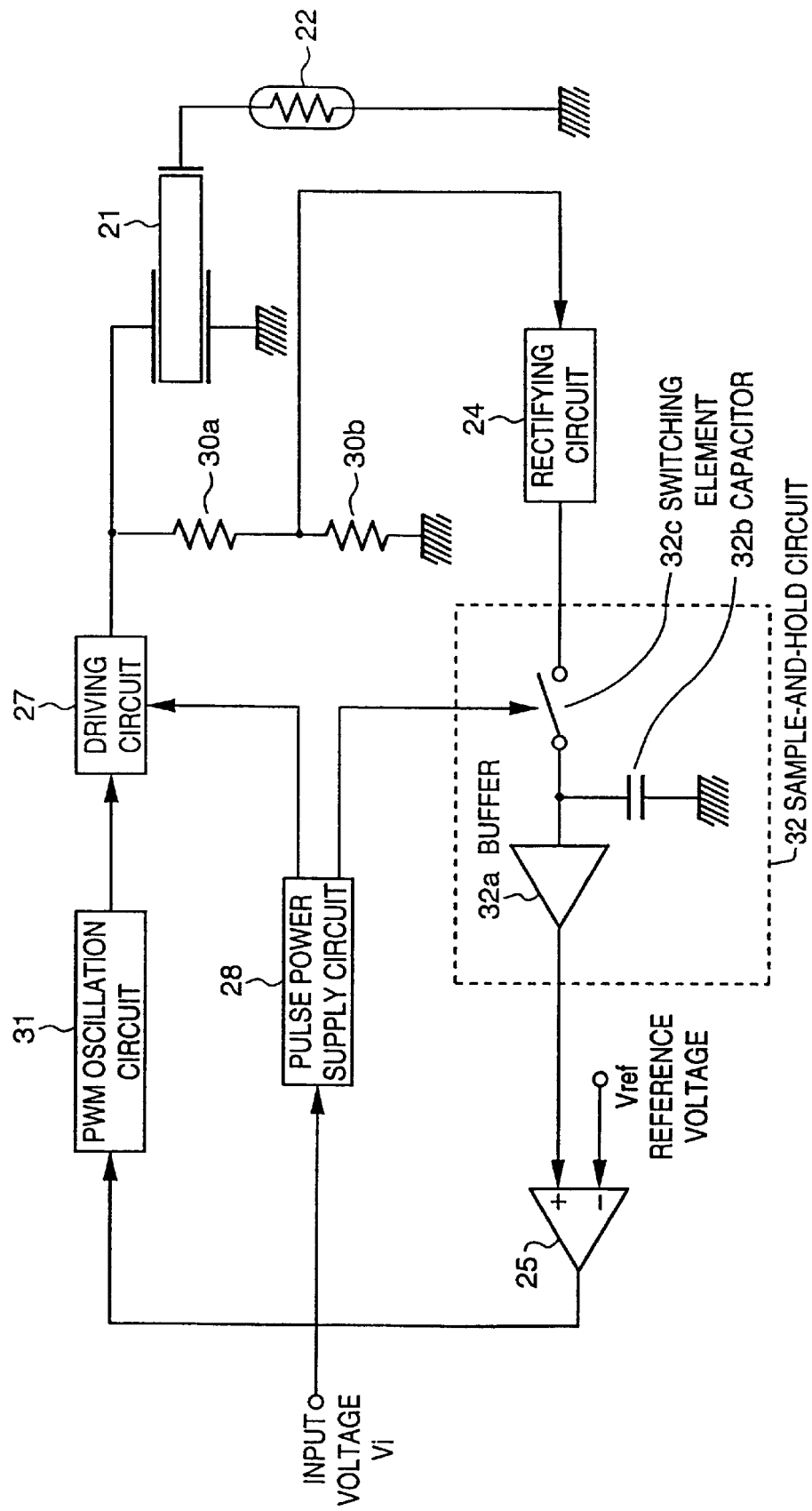
FIG. 27 is a block diagram of a piezoelectric transformer control circuit as the second modification of the third embodiment of the present invention.
Figure 28:
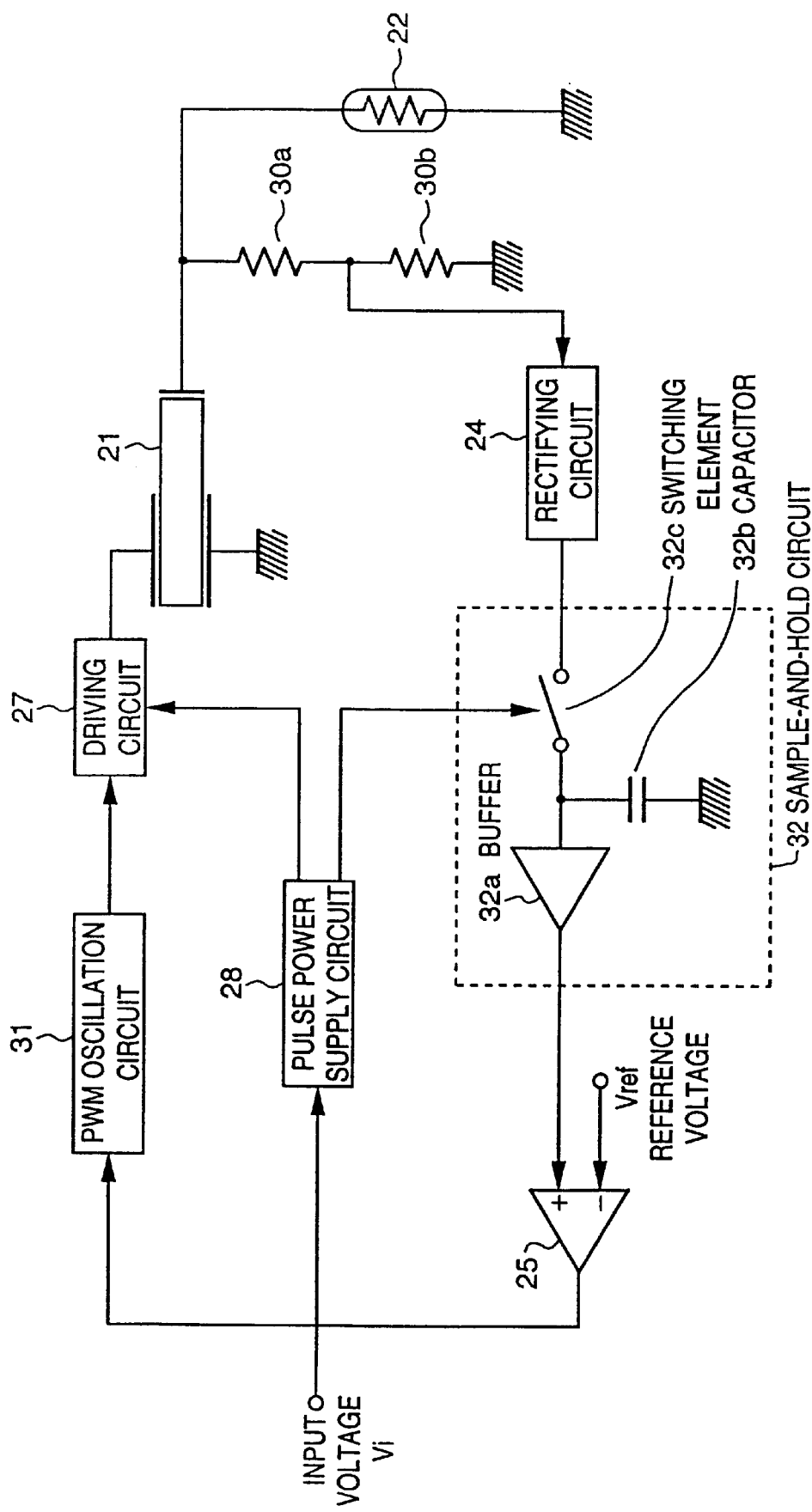
FIG. 28 is a block diagram of a piezoelectric transformer control circuit as the third modification of the third embodiment of the present invention.
Figure 29:
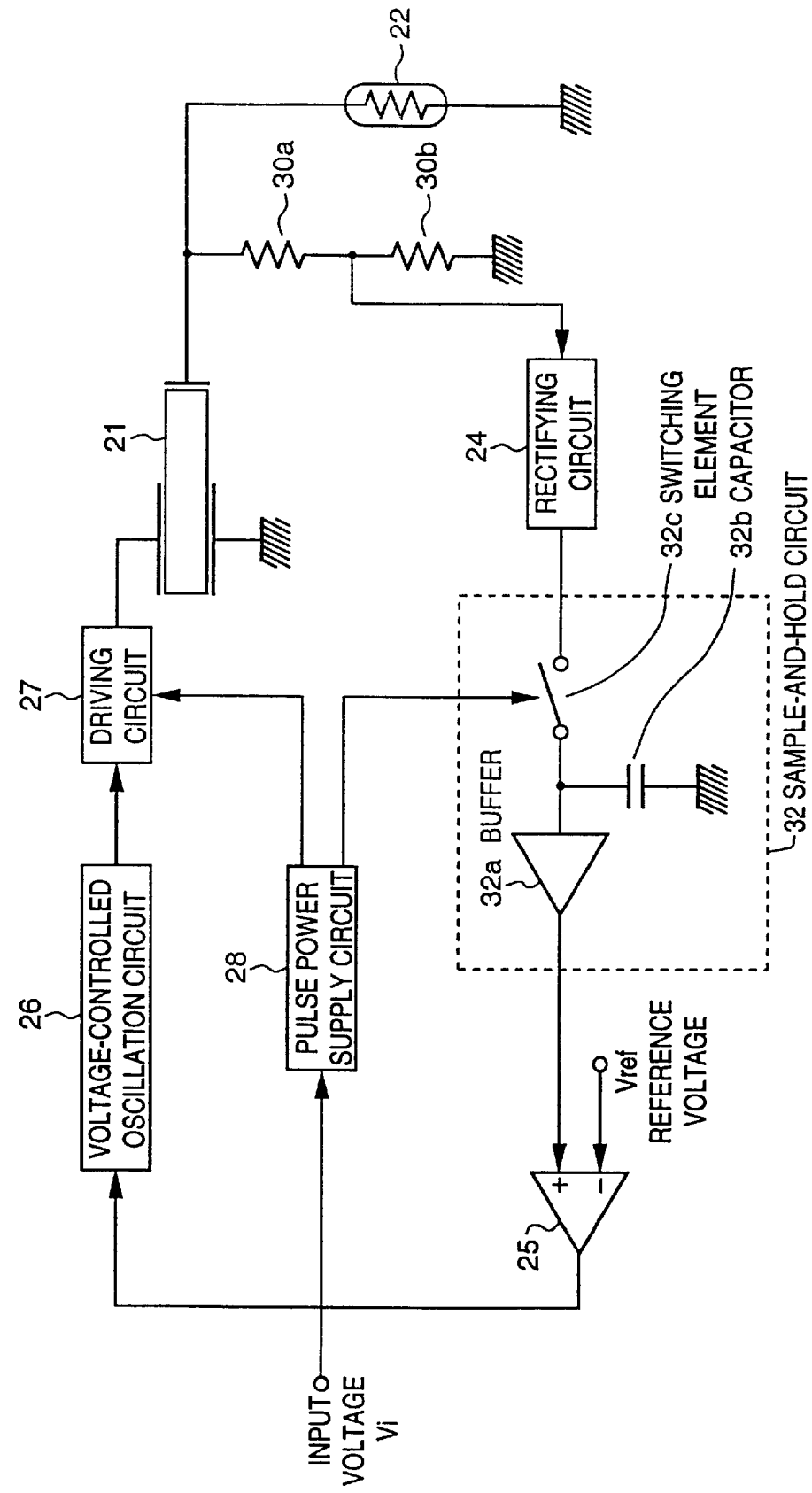
FIG. 29 is a block diagram of a piezoelectric transformer control circuit as the fourth modification of the third embodiment of the present invention.

Also, FIGS. 27 to 29 illustrate a circuit having a function of holding the driving voltage to the piezoelectric transformer at the value in the oscillation period and circuits having a function of holding the output voltage from the piezoelectric transformer at the value in the oscillation period, instead of the function of holding the lamp current at the value in the oscillation period.

In the circuit (FIG. 27) having the function of holding the driving voltage to the piezoelectric transformer at the value in the oscillation period and the circuits (FIGS. 28 and 29) having the function of holding the output voltage from the piezoelectric transformer at the value in the oscillation period, as in the above embodiment (FIG. 24), the sample-and-hold circuit 32 is inserted between the rectifying circuit 24 and the error amplifier 25 and controlled by the signal from the pulse oscillation circuit 28a in the pulse power supply circuit 28. Consequently, even in the idle period the driving voltage or the output voltage of the piezoelectric transformer 21 can be adjusted by intermittent oscillation while the driving voltage or the output voltage is held at the value in the oscillation period. Note that in the circuits shown in FIGS. 27 and 28, the PWM oscillation circuit 31 is used in place of the voltage-controlled oscillation circuit 26 as in FIGS. 7 and 8, respectively. The rests of the arrangements in FIGS. 27 and 28 are the same as in FIG. 24. Therefore, the same reference numerals as in FIG. 24 denote the same parts in FIGS. 27 and 28, and a detailed description thereof will be omitted.

The fifth and sixth modifications of the third embodiment in each of which a so-called bridge type driving circuit including transistors is used as the driving circuit 27 in FIG. 24 will be described below with reference to FIGS. 30 and 31, respectively.

Figure 30:
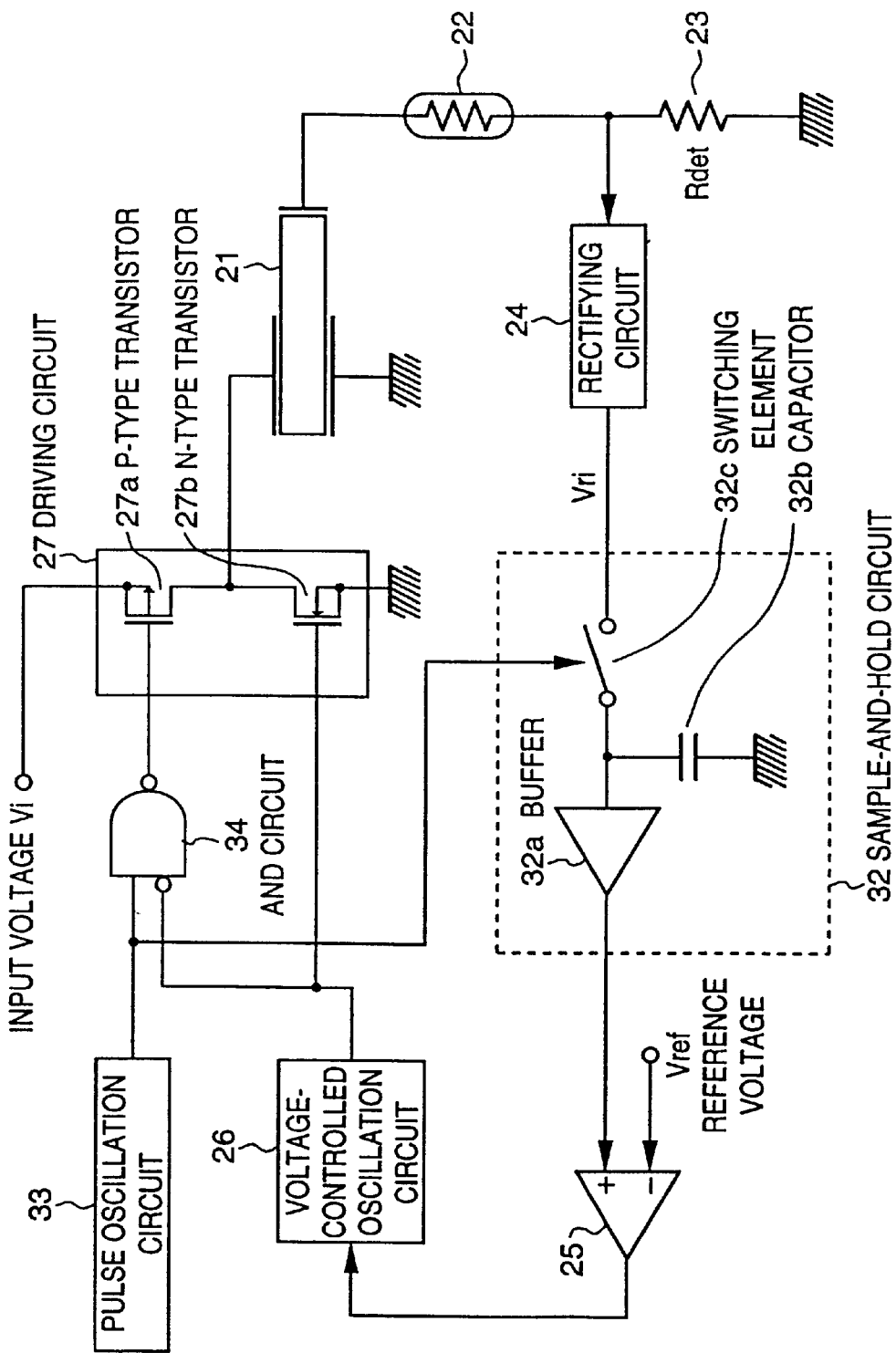
FIG. 30 is a block diagram of a piezoelectric transformer control circuit as the fifth modification of the third embodiment of the present invention.
Figure 31:
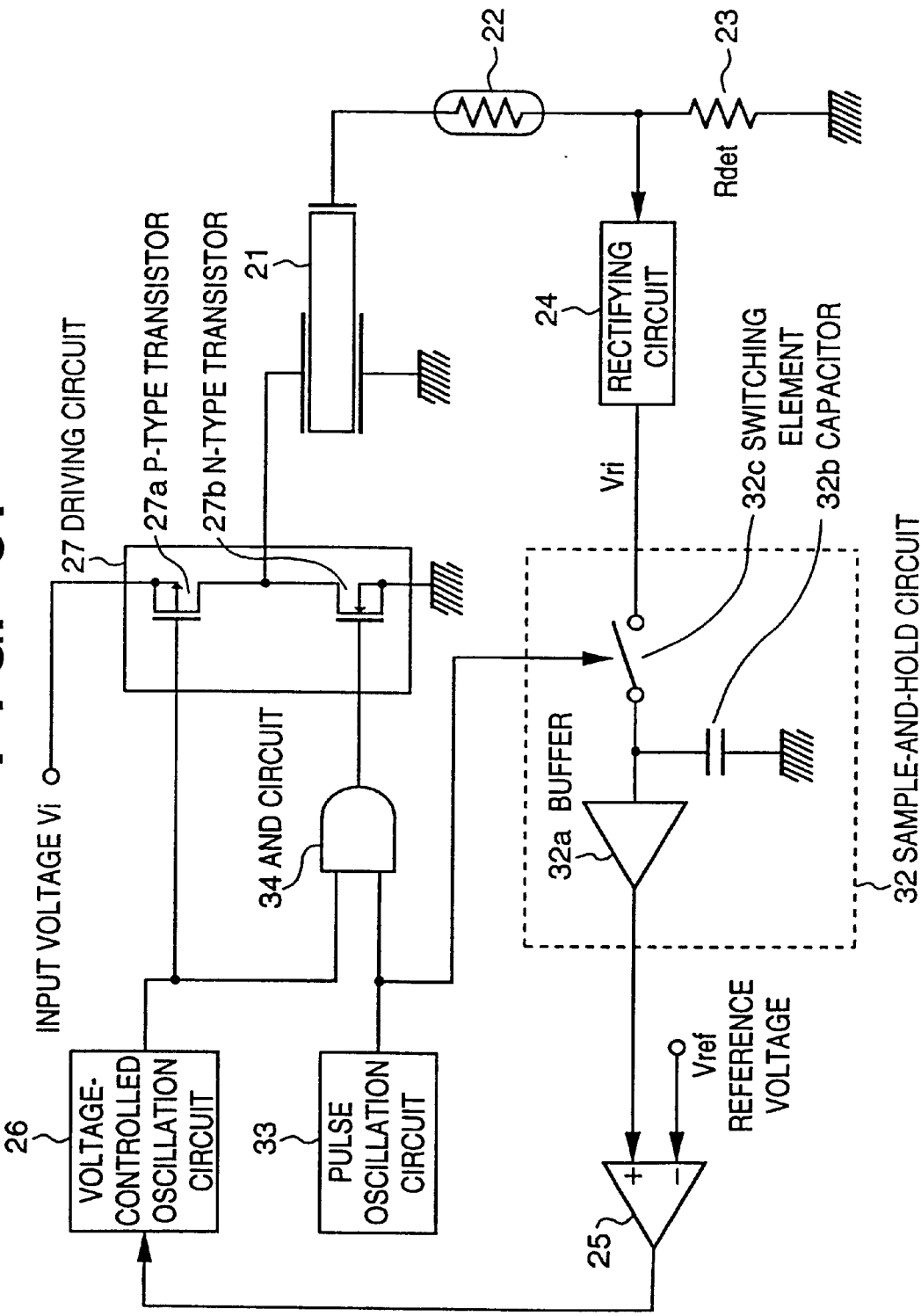
FIG. 31 is a block diagram of a piezoelectric transformer control circuit as the sixth modification of the third embodiment of the present invention.

FIGS. 30 and 31 are block diagrams of piezoelectric transformer control circuits as the fifth and sixth modifications of the third embodiment of the present invention. In each of FIGS. 30 and 31, a half-bridge circuit configuration is shown as the driving circuit 27. In the configuration shown in FIG. 24, the driving circuit 27 itself is intermittently driven by using the pulse power supply circuit 28. However, when bridge type driving circuits as in these modifications are used, a pulse oscillation circuit 33 and an AND circuit 34 are used. The pulse oscillation circuit 33 includes an adjusting means (not shown) and can adjust the duty ratio of an output pulse signal.

In the fifth and sixth modifications, the driving circuit 27 includes a p-type transistor (FET: Field-Effect Transistor) 27a and an n-type transistor (FET) 27b which are so connected as to form a half-bridge circuit. These two transistors (27a and 27b) alternately perform switching by using the output pulse signal from a pulse oscillation circuit 33, the output oscillation signal from the voltage-controlled oscillation circuit 26, and an AND signal obtained from these signals by an AND circuit 34. By this switching operation of the driving circuit 27, a driving voltage (AC voltage) whose amplitude is the input voltage Vi is intermittently applied to the piezoelectric transformer 21. Also, the sample-and-hold circuit 32 is controlled by the output pulse signal from the pulse oscillation circuit 33. The rests of the configurations in FIGS. 30 and 31 are the same as in FIG. 24. Therefore, the same reference numerals as in FIG. 24 denote the same parts in FIGS. 30 and 31, and a detailed description thereof will be omitted.

The above fifth and sixth modifications are described on the basis of the control circuit shown in FIG. 24. However, in each of the control circuits shown in FIGS. 26 to 29, it is naturally possible to use a half-bridge circuit as the driving circuit 27 and use the pulse oscillation circuit 33 and the AND circuit 34 instead of the pulse power supply circuit 28. It is also naturally possible to use a full-bridge circuit, instead of a half-bridge circuit, as the driving circuit 27.

As described above, the third embodiment can provide a piezoelectric transformer control circuit capable of simultaneously accomplishing the function of holding the lamp current of the cold-cathode fluorescent lamp as a load, the driving voltage, or the output voltage substantially constant and the function of adjusting the brightness by intermittent oscillation.

[Fourth Embodiment]

In the control circuit shown in FIG. 24 according to the third embodiment described above, when the piezoelectric transformer is intermittently driven in order to dim the cold-cathode fluoresent lamp, the voltage, which is equivalent to the lamp current in the oscillation period, to the voltage-controlled oscillation circuit 26 can be held under the control of the sample-and-hold circuit 32. Therefore, even in the idle period the driving state of the driving circuit 27 during the oscillation period can be held. Furthermore, the brightness of the cold-cathode fluorescent lamp can also be adjusted because the average lamp current can be adjusted by changing the length of the oscillation period or the idle period.

Figure 6A:
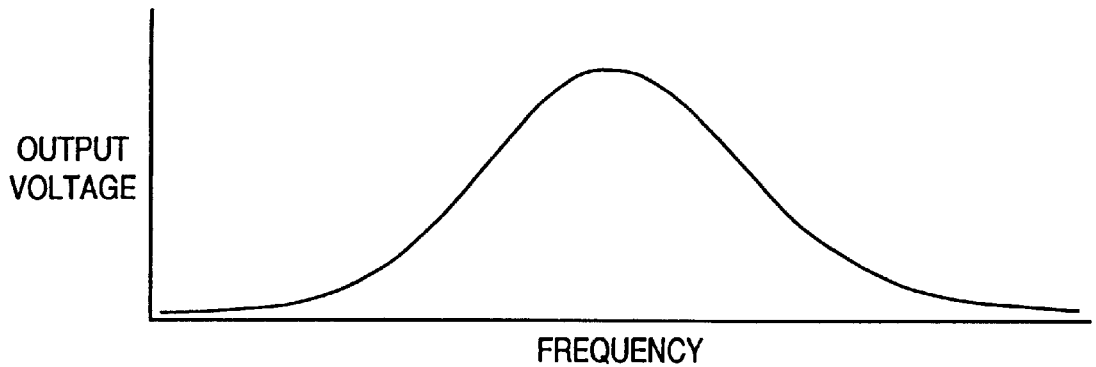
FIG. 6A is a graph for explaining the relationship between the frequency of a piezoelectric transformer and the output voltage of a piezoelectric transformer.
Figure 6B:
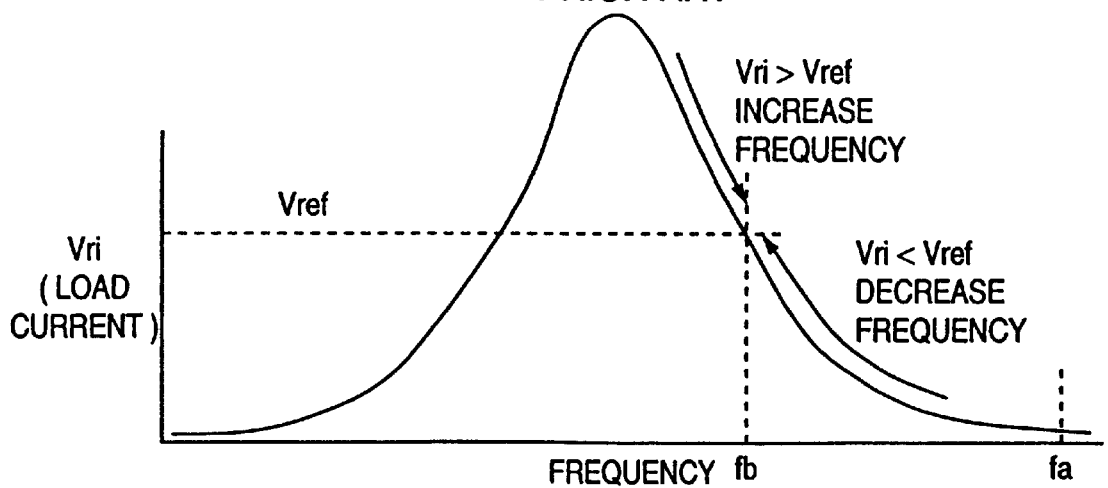
FIG. 6B is a graph for explaining the relationship between the frequency of a piezoelectric transformer and the load current of a load connected to the piezoelectric transformer.
Figure 7:
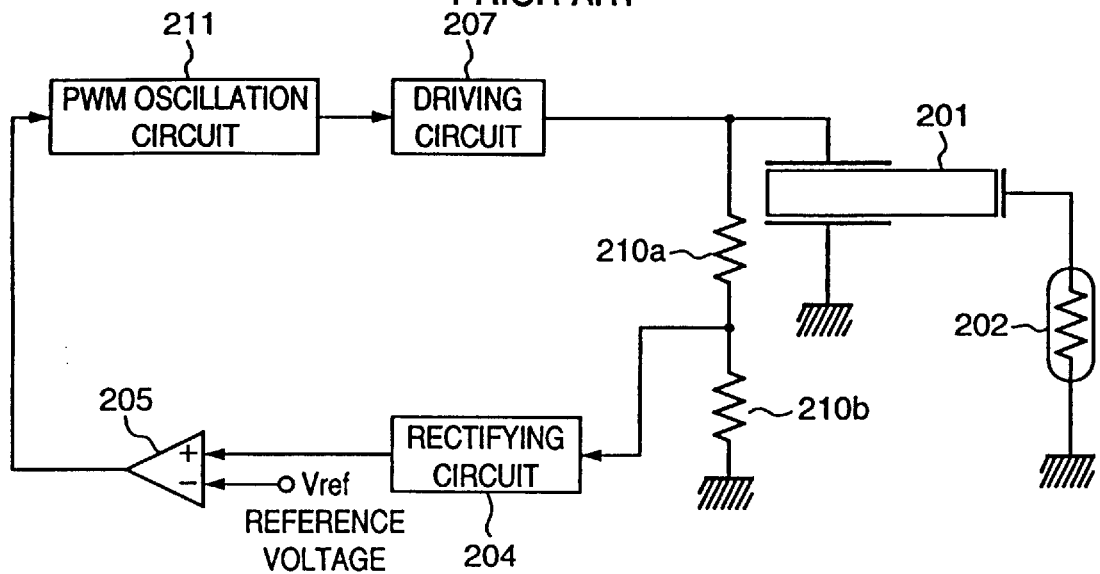
FIG. 7 is a block diagram of a circuit having a function of holding the driving voltage to a piezoelectric transformer substantially constant.
Figure 8:
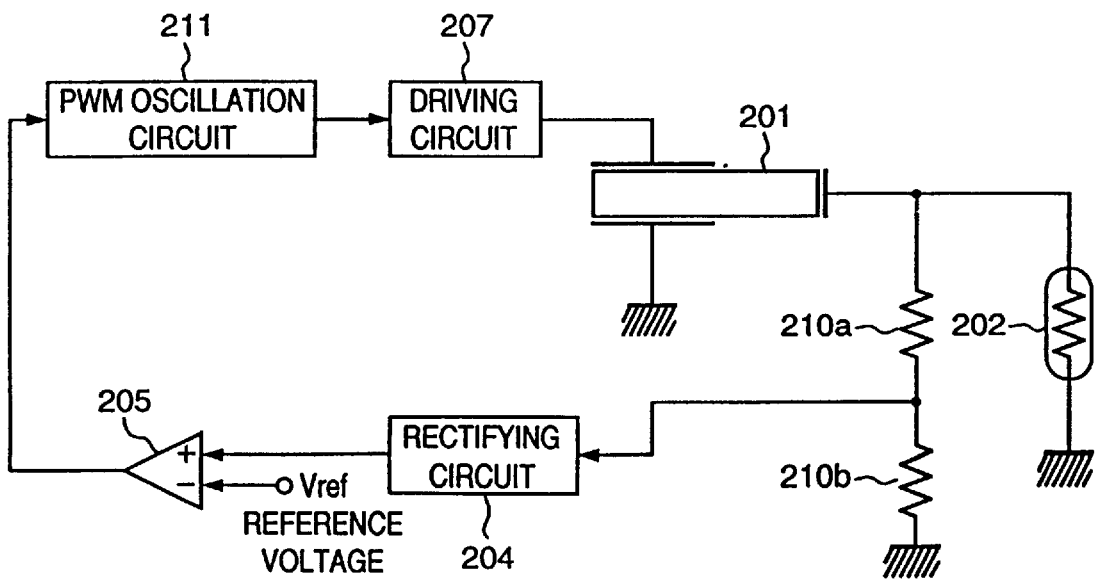
FIG. 8 is a block diagram of a circuit having a function of holding the output voltage from a piezoelectric transformer substantially constant.
Figure 9:
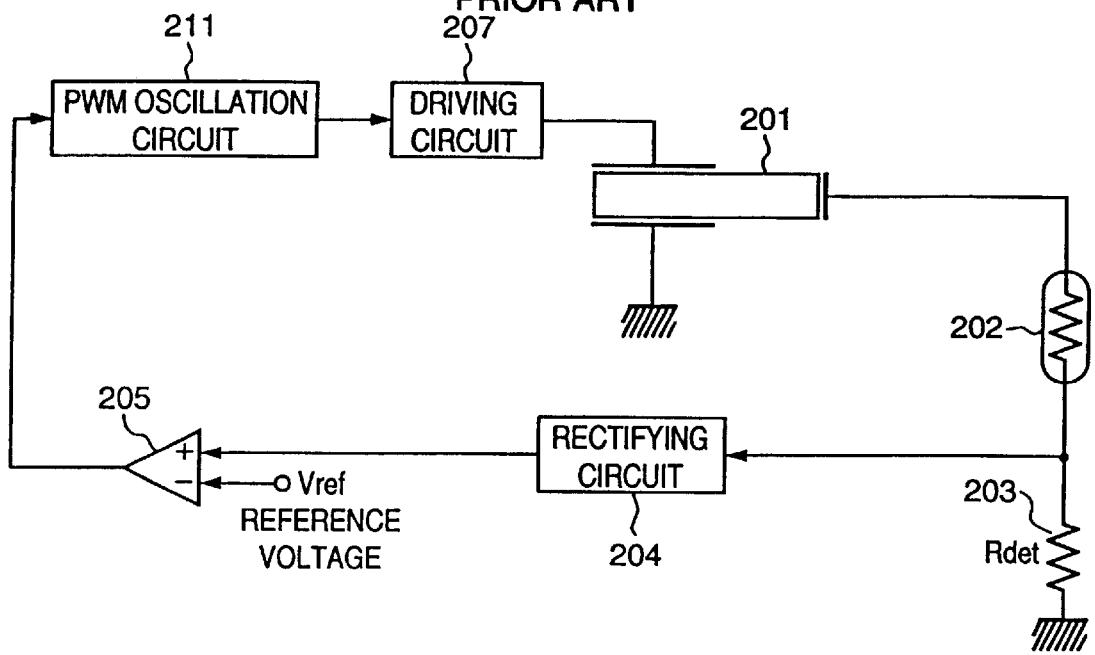
FIG. 9 is a block diagram of a circuit having a function of holding the lamp current of a piezoelectric transformer substantially constant.
Figure 10:
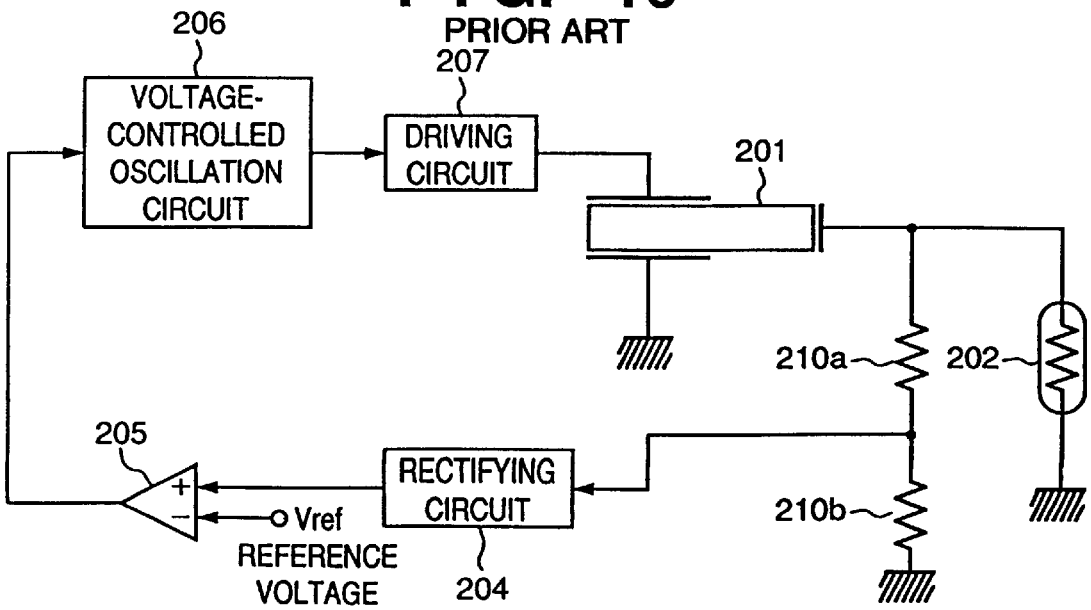
FIG. 10 is a block diagram of a circuit having a function of holding the output voltage from a piezoelectric transformer substantially constant.

In the above method, however, although the relative brightness can be changed from about 10% to 100% by adjusting the oscillation period (duty) of the pulse power supply circuit from 20% to 100%, it is difficult to adjust the relative brightness to 0% for the reason explained below. When the oscillation period is set to 0%, i.e., when the driving of the piezoelectric transformer 21 is stopped, the lamp current becomes zero. Accordingly, the frequency is swept to a lower limit value (e.g., a value close to the left end in the hilly characteristic shown in FIG. 6B) by the frequency control which the voltage-controlled oscillation circuit 26 performs to hold the lamp current at a predetermined value. This lower limit frequency largely differs from the resonance frequency. Therefore, the piezoelectric transformer 21 cannot generate a high voltage necessary to turn on the cold-cathode fluorescent lamp, so the cold-cathode fluoresent lamp cannot be turned on again. Also, even if the cold-cathode fluoresent lamp is turned on again, no normal control can be performed because frequency control by which the lamp current is held substantially constant is positive feedback control on the left side of the resonance characteristic. That is, there is the possibility that the operation cannot return to a normal one after the brightness is adjusted to 0%. Therefore, the fourth embodiment which has solved this problem will be described below with reference to FIGS. 32 to 36.

Figure 32:
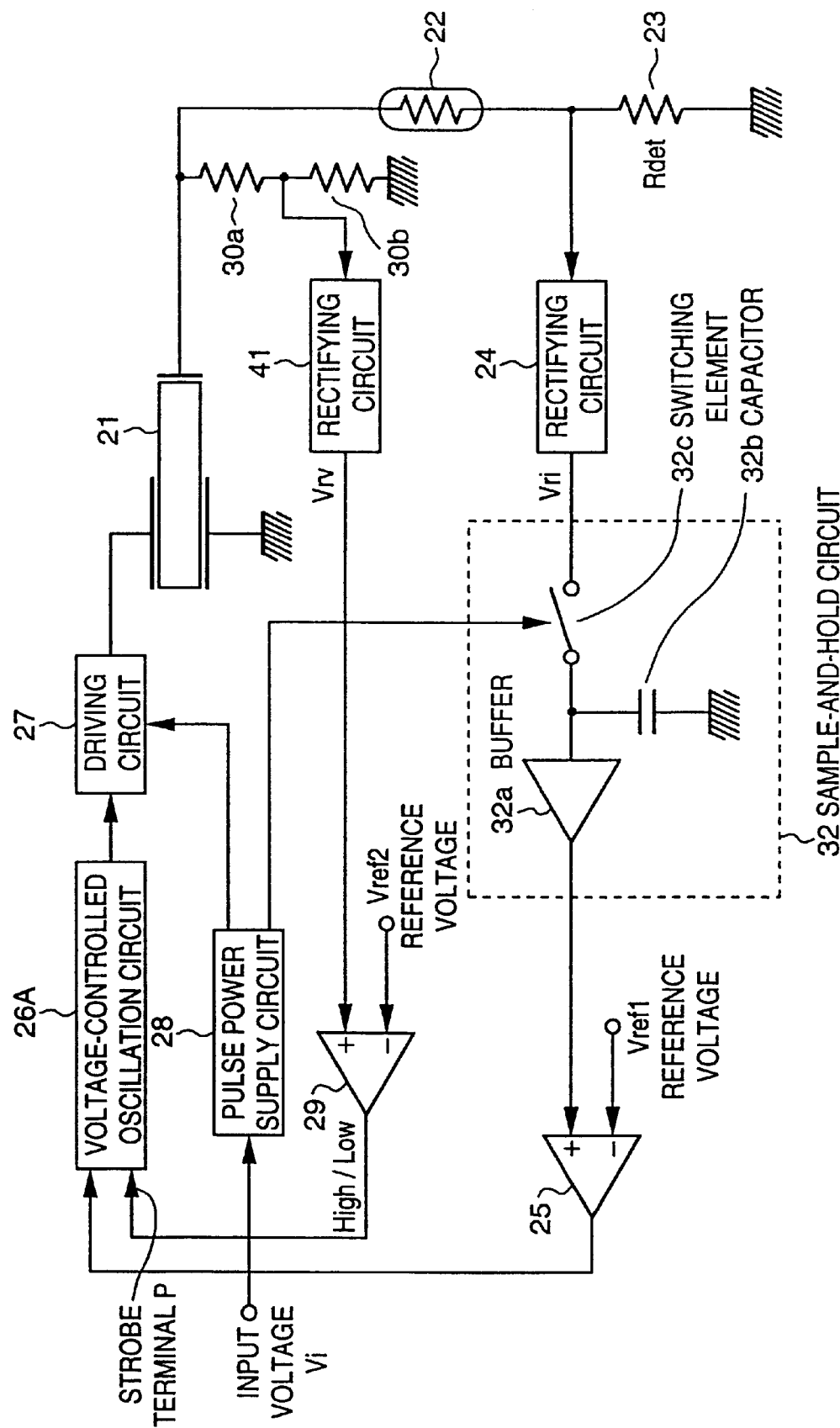
FIG. 32 is a block diagram of a piezoelectric transformer control circuit as the fourth embodiment of the present invention.

FIG. 32 is a block diagram of a piezoelectric transformer control circuit as the fourth embodiment of the present invention. In FIG. 32, the same reference numerals as in the third embodiment (FIG. 24) denote the same parts, and a detailed description thereof will be omitted.

Reference numerals 30a and 30b denote detecting resistors for detecting an output voltage from a piezoelectric transformer 21; 41, a rectifying circuit for converting an AC voltage detected by the detecting resistor 30b into a DC voltage; and 29, a voltage comparator for comparing an output detection voltage Vrv, which is rectified by the rectifying circuit 41 and represents the output voltage from the piezoelectric transformer 21, with a reference voltage Vref2, and outputting a High or Low signal in accordance with the comparison result. A voltage-controlled oscillation circuit 26A is a circuit, similar to the voltage-controlled oscillation circuit 26 in FIG. 24, which outputs an oscillation signal to a driving circuit 27 in accordance with an output voltage from an error amplifier 25. This voltage-controlled oscillation circuit 26A has a strobe terminal P for maximizing the frequency of the output oscillation signal from the voltage-controlled oscillation circuit 26A. The configuration and operation of the voltage-controlled oscillation circuit 26A will be described below.

Figure 33:
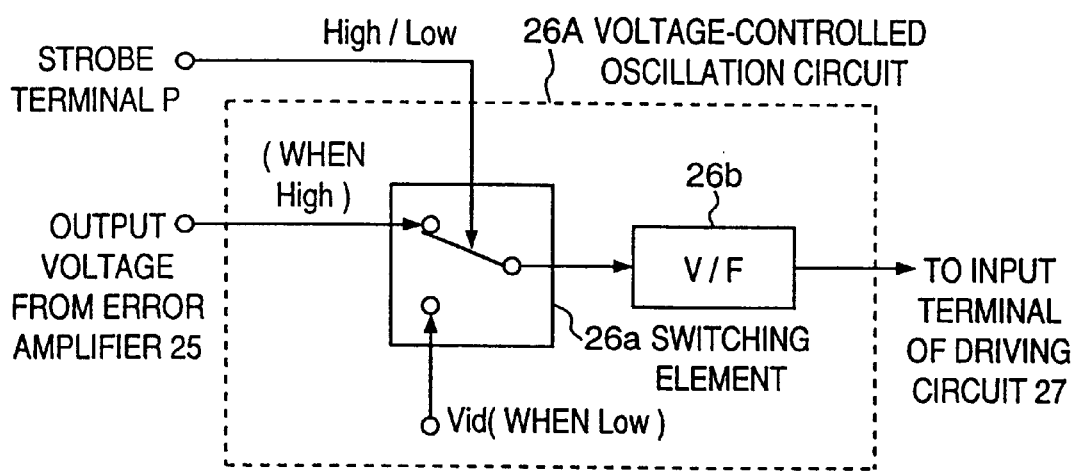
FIG. 33 is a view for explaining the configuration of a voltage-controlled oscillation circuit as the fourth embodiment of the present invention.

FIG. 33 is a view showing the configuration of the voltage-controlled oscillation circuit as the fourth embodiment of the present invention.

Referring to FIG. 33, a switching element 26a receives the output voltage from the error amplifier 25 and a internal voltage Vid from the voltage comparator 29. This internal voltage Vid is used to fix the oscillation signal to the driving circuit 27 to an upper limit frequency (maximum value). These inputs are switched by the switching element 26a in accordance with the state of an input signal to the strobe terminal P. The selected input is applied to a V/F converter 26b and converted into a frequency. The upper limit frequency is desirably a frequency at which the output voltage takes a minimum value (e.g., fa in FIG. 6B) on the high-frequency side in the resonance frequency of the piezoelectric transformer 21. This is because a piezoelectric transformer generally has a resonance frequency at each integral multiple frequency, so a frequency higher than the upper limit frequency enters the range of the next hilly resonance characteristic, and this makes normal control impossible to perform.

In this embodiment, the output voltage from the error amplifier 25 is applied to the voltage-controlled oscillation circuit 26A. When "High" is input to the strobe terminal P, a signal of a frequency corresponding to the output voltage from the error amplifier 25 is output (normal operation). When "Low" is input, a signal of a frequency corresponding to the internal voltage Vid is output.

When the oscillation period of a pulse power supply circuit 28 (FIG. 25) is 20% to 100%, the voltage Vrv detected by the detecting resistors 30a and 30b and the rectifying circuit 41 is higher than the reference value Vref 2. Accordingly, the voltage comparator 29 outputs "High", and the voltage-controlled oscillation circuit 26A performs the normal operation described above.

On the other hand, when the oscillation period is 0%, the piezoelectric transformer 21 is not driven, so the output voltage from the piezoelectric transformer 21 is substantially zero. At this time, the output detection voltage from the rectifying circuit 41 is lower than the reference value Vref2, and the voltage comparator 29 outputs "Low". Consequently, the voltage-controlled oscillation circuit 26A outputs an oscillation signal of the upper limit frequency described above.

When the oscillation period is prolonged from 0% by adjusting a pulse oscillation circuit 28a in the pulse power supply circuit 28, an output voltage appears at the output of the piezoelectric transformer 21. When the output detection voltage, which represents the output voltage from the piezoelectric transformer 21, from the rectifying circuit 4 becomes higher than Vref2, the voltage-controlled oscillation circuit 6A returns to the normal operation. In the normal operation, frequency control for controlling the lamp current to a predetermined value is performed. Therefore, the cold-cathode fluoresent lamp can be turned on again.

<Modifications of Fourth Embodiment>

Figure 34:
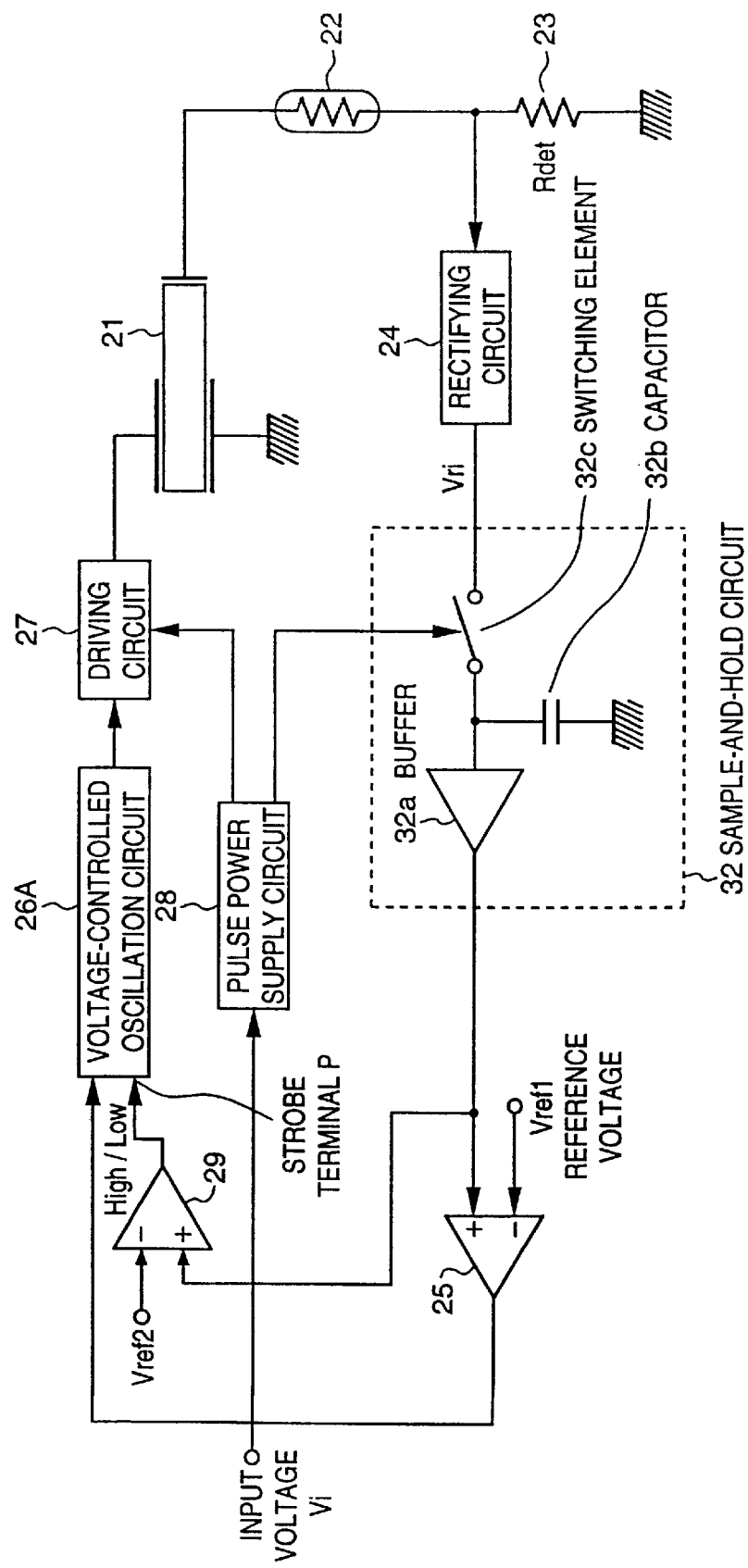
FIG. 34 is a block diagram of a piezoelectric transformer control circuit as the first modification of the fourth embodiment of the present invention.

FIG. 34 is a block diagram of a piezoelectric transformer control circuit as the first modification of the fourth embodiment of the present invention.

The difference of FIG. 34 from the arrangement shown in FIG. 32 is as follows. The output from the sample-and-hold circuit 32 is applied to the voltage comparator 29. If the voltage is lower than the predetermined reference Vref2, it is determined that the state of the cold-cathode fluorescent lamp is OFF, and the voltage comparator 29 outputs "Low". Accordingly, the voltage-controlled oscillation circuit 26A outputs a signal of the upper limit frequency. On the other hand, if the voltage is higher than the predetermined voltage Vref2, the voltage comparator 29 outputs "High", and the voltage-controlled oscillation circuit 26A performs the normal operation. The rest of the arrangement is the same as in the third and fourth embodiments described above, so a detailed description thereof will be omitted.

Figure 35:
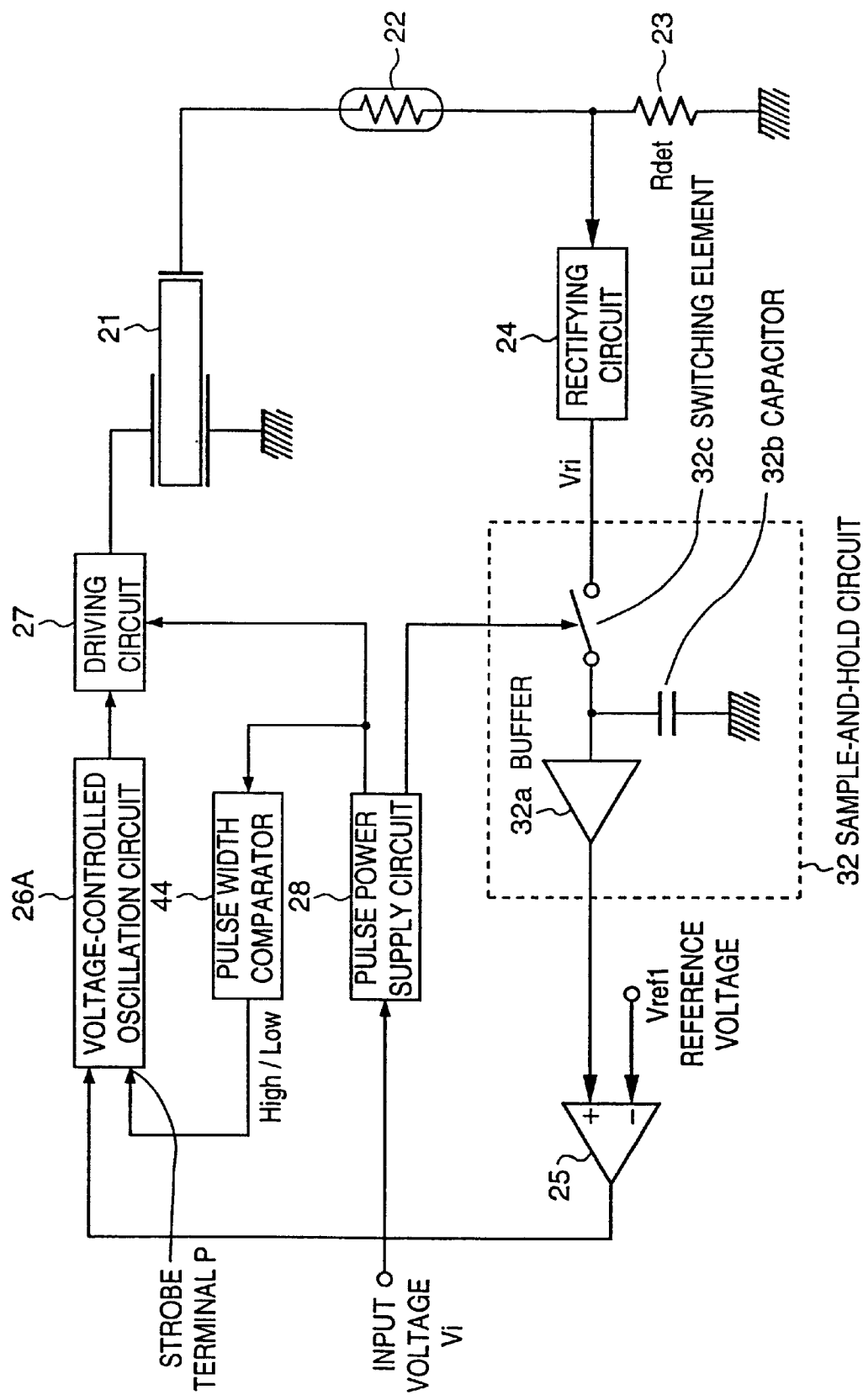
FIG. 35 is a block diagram of a piezoelectric transformer control circuit as the second modification of the fourth embodiment of the present invention.

FIG. 35 is a block diagram of a piezoelectric transformer control circuit as the second modification of the fourth embodiment of the present invention.

FIG. 35 differs from the arrangement shown in FIG. 32 in that the control circuit in FIG. 35 includes a pulse width comparator 44 for comparing the duty ratio of the output pulse voltage from the pulse power supply circuit 28 with a predetermined duty ratio and outputting a High or Low signal. If the duty ratio of the pulse voltage is lower than the predetermined duty ratio (e.g. 5% or less), the pulse width comparator 44 outputs "Low". Consequently, the voltage-controlled oscillation circuit 26A outputs a signal of the upper limit frequency. On the other hand, if the duty ratio of the pulse voltage is higher than the predetermined duty ratio, the pulse width comparator 44 outputs "High", and the voltage-controlled oscillation circuit 26A performs the normal operation. The rest of the arrangement is the same as in the third and fourth embodiments described above, so a detailed description thereof will be omitted.

Furthermore, as the third modification of the fourth embodiment, a circuit configuration in which a so-called bridge type driving circuit including transistors is used as the driving circuit 27 in FIG. 32 described above will be described below with reference to FIG. 36.

Figure 36:
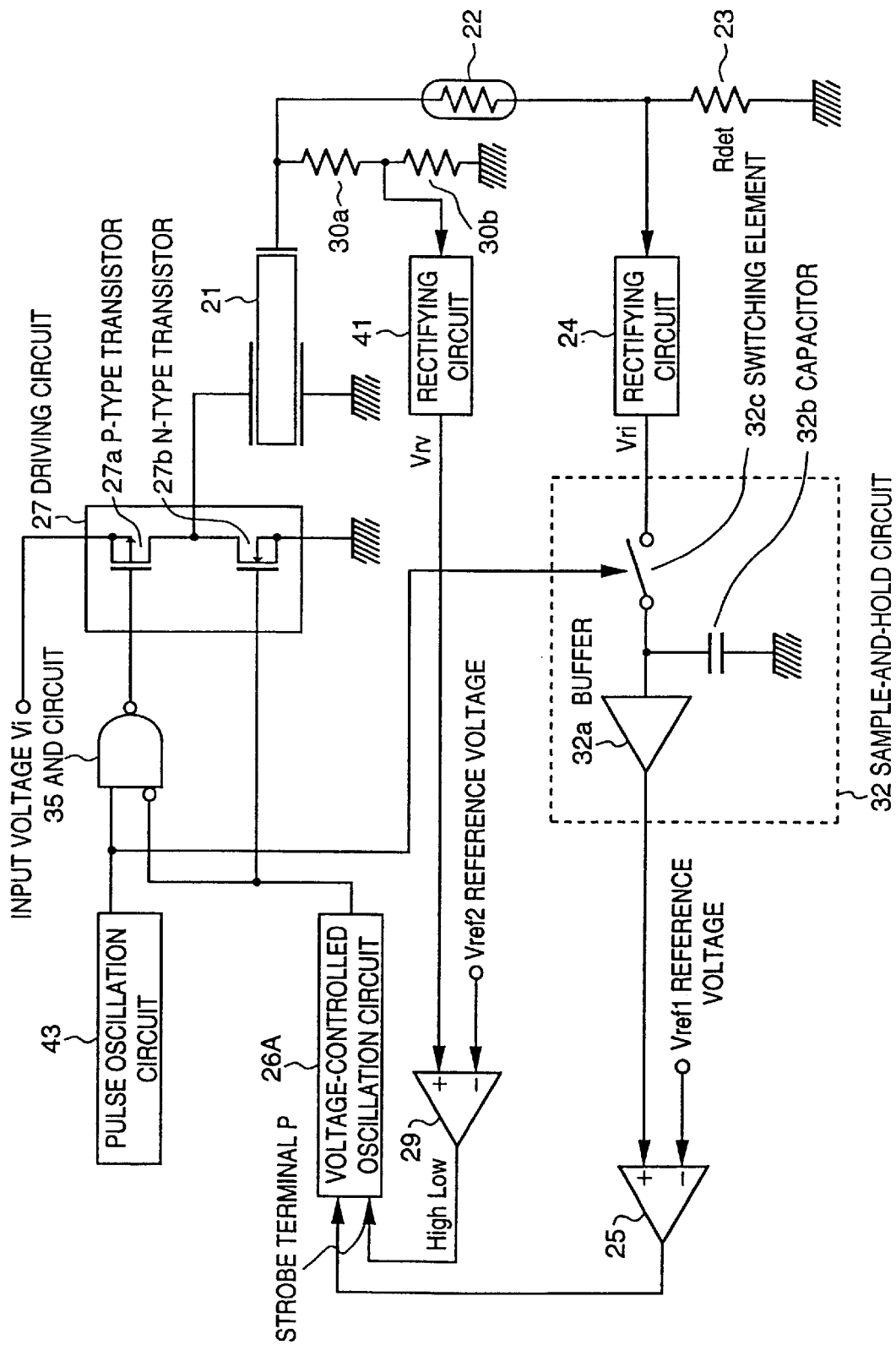
FIG. 36 is a block diagram of a piezoelectric transformer control circuit as the third modification of the fourth embodiment of the present invention.

FIG. 36 is a block diagram of a piezoelectric transformer control circuit as the third modification of the fourth embodiment of the present invention. In FIG. 36, a half-bridge circuit configuration is shown as the driving circuit 27. In the configuration shown in FIG. 32, the driving circuit 27 itself is intermittently driven by using the pulse power supply circuit 28. However, when a bridge type driving circuit as in this modification is used, a pulse oscillation circuit 43 and an AND circuit 35 are used. The pulse oscillation circuit 43 includes an adjusting means (not shown) and can adjust the duty ratio of an output pulse signal.

In the third modification, the driving circuit 27 includes a p-type transistor (FET: Field-Effect Transistor) 27a and an n-type transistor (FET) 27b which are so connected as to form a half-bridge circuit. These two transistors (27a and 27b) alternately perform switching by using the output pulse signal from the pulse oscillation circuit 43, the output oscillation signal from the voltage-controlled oscillation circuit 26A, and an AND signal obtained from these signals by the AND circuit 35. By this switching operation of the driving circuit 27, a driving voltage (AC voltage) whose amplitude is an input voltage Vi is intermittently applied to the piezoelectric transformer 21. Also, the sample-and-hold circuit 32 is controlled by the output pulse signal from the pulse oscillation circuit 43. The rest of the configuration in FIG. 36 is the same as in FIG. 32. Therefore, the same reference numerals as in FIG. 32 denote the same parts in FIG. 36, and a detailed description thereof will be omitted.

The above third modification is described on the basis of the control circuit shown in FIG. 32. However, in each of the control circuits shown in FIGS. 34 and 35, it is naturally possible to use a half-bridge circuit as the driving circuit 27 and use the pulse oscillation circuit 43 and the AND circuit 35 instead of the pulse power supply circuit 28. In the case of the modification shown in FIG. 35, however, the output pulse signal from the pulse oscillation circuit 43 is applied to the pulse width comparator 44, and the duty ratio of this pulse signal is compared with the predetermined value (duty ratio). It is also naturally possible to use a full-bridge circuit, instead of a half-bridge circuit, as the driving circuit 27.

As described above, the fourth embodiment can provide a piezoelectric transformer control circuit capable of simultaneously accomplishing the function of holding the lamp current of the cold-cathode fluoresent lamp as a load, the driving voltage, or the output voltage substantially constant and the function of adjusting the brightness by intermittent oscillation, and particularly capable of turning off and again turning on the cold-cathode fluoresent lamp by brightness adjustment.

That is, brightness adjustment is realized over the range of 0% to 100% of the oscillation period of the pulse power supply circuit or the pulse oscillation circuit. When it is detected that the cold-cathode fluoresent lamp is turned off, the oscillation frequency of the voltage-controlled oscillation circuit is set to the upper limit value, thereby adjusting the oscillation period to be larger than 0%. Consequently, frequency control by which the lamp current is set to a predetermined value is restarted to turn on the cold-cathode fluoresent lamp again.

[Fifth Embodiment]

The problem of the third embodiment proposed in the fourth embodiment can also be solved by the fifth embodiment to be described below. The fifth embodiment will be described below with reference to FIGS. 37 to 41.

Figure 37:
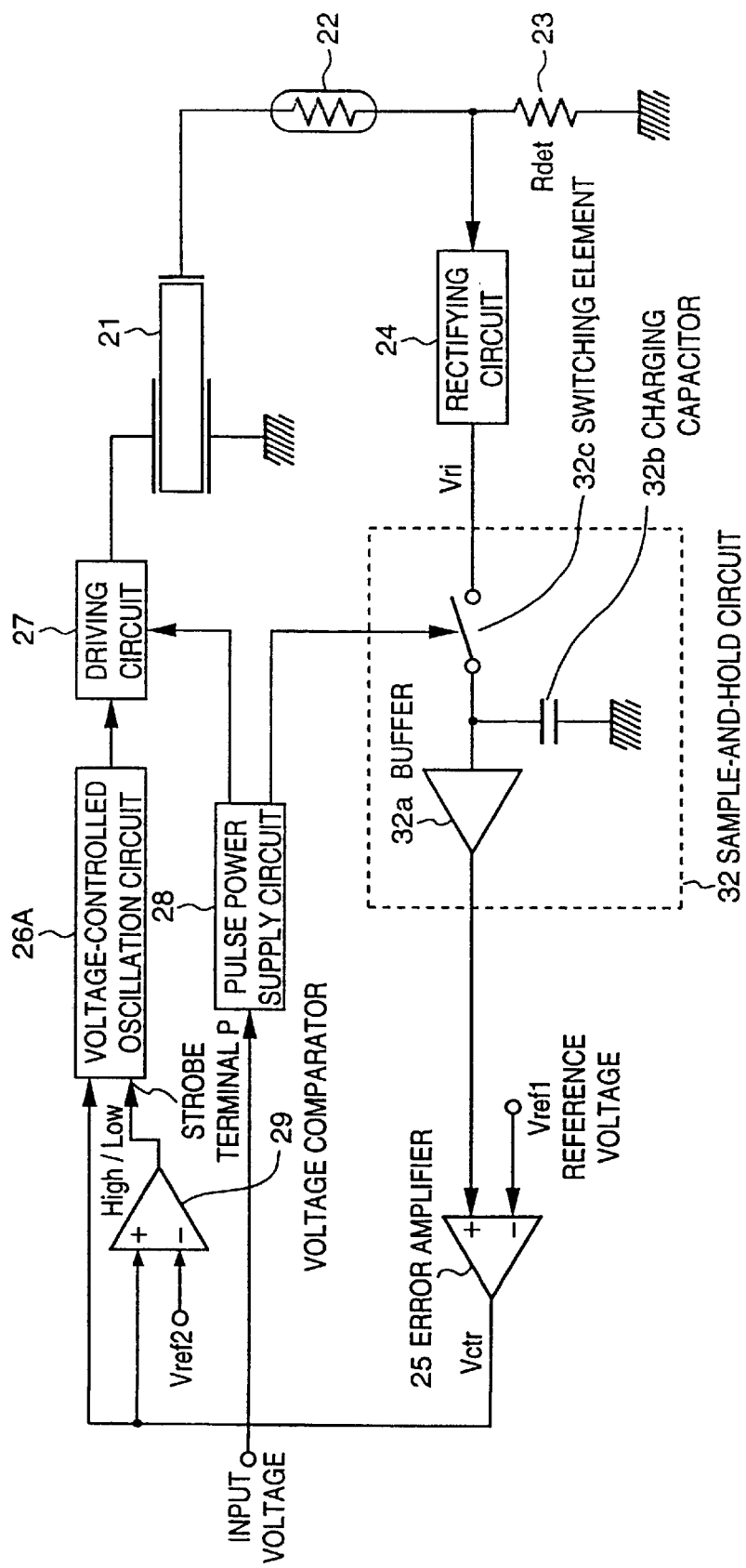
FIG. 37 is a block diagram of a piezoelectric transformer control circuit as the fifth embodiment of the present invention.

FIG. 37 is a block diagram of a piezoelectric transformer control circuit as the fifth embodiment of the present invention. In FIG. 37, the same reference numerals as in the third embodiment (FIG. 24) denote the same parts, and a detailed description thereof will be omitted.

In FIG. 37, reference numeral 29 denotes a voltage comparator for comparing an output control voltage Vctr from an error amplifier 25 with a reference voltage Vref2 and outputting a High or Low signal in accordance with the comparison result. A voltage-controlled oscillation circuit 26A is a circuit, similar to the voltage-controlled oscillation circuit 26 in FIG. 24, which outputs an oscillation signal to a driving circuit 27 in accordance with the output voltage from the error amplifier 25. This voltage-controlled oscillation circuit 26A further includes a strobe terminal P for setting the frequency of the output oscillation signal from the voltage-controlled oscillation circuit 26A to an upper limit frequency (initial frequency). The configuration and operation of the voltage-controlled oscillation circuit 26A will be described below.

Figure 38:
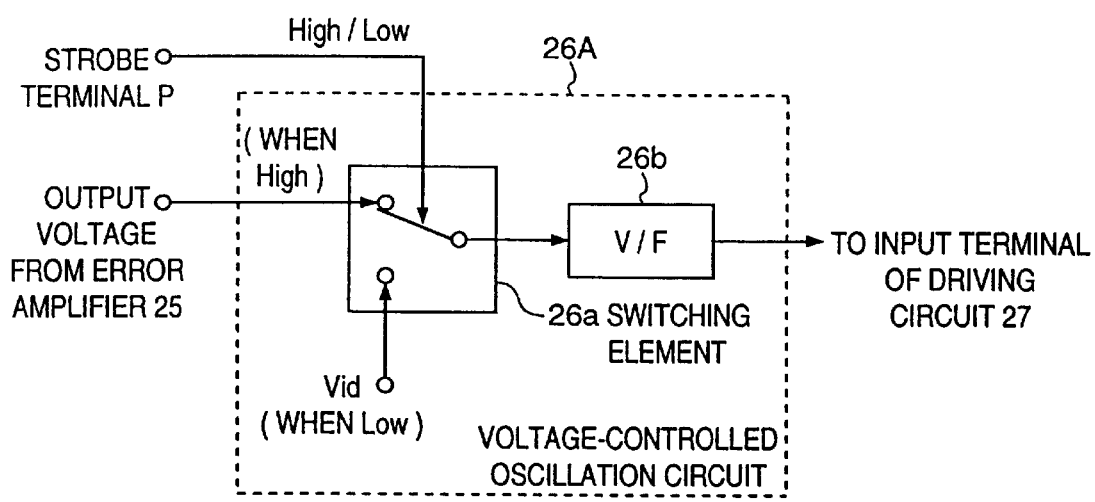
FIG. 38 is a view for explaining the configuration of a voltage-controlled oscillation circuit as the fifth embodiment of the present invention.

FIG. 38 is a view showing the configuration of the voltage-controlled oscillation circuit as the fifth embodiment of the present invention.

Referring to FIG. 38, a switching element 26a receives the output voltage from an error amplifier 25 and an internal voltage Vid. This internal voltage Vid is used to fix the oscillation signal to a driving circuit 27 to the upper limit frequency (initial frequency). These inputs are switched by the switching element 26a in accordance with the state of an input signal to a strobe terminal P. The selected input is applied to a V/F converter 26b and converted into a frequency.

In this embodiment, when "High" is input to the strobe terminal P, a voltage-controlled oscillation circuit 26A selects the output voltage from the error amplifier 25 and outputs a signal of a frequency corresponding to the output voltage to the driving circuit 27. This operation sequence will be called a "normal dimming operation" hereinafter. On the other hand, when "Low" is input to the strobe terminal P, the voltage-controlled oscillation circuit 26A selects the internal voltage Vid and outputs a signal of a frequency corresponding to the internal voltage Vid to the driving circuit 27.

The upper limit frequency is desirably a frequency, at which the output voltage takes a minimum value (e.g., fa in FIG. 6B), within a predetermined control range on a high-frequency side in one of a plurality of resonance characteristics of a piezoelectric transformer 21, which is used by the control circuit for control. This is because a piezoelectric transformer generally has a resonance frequency at each integral multiple frequency of its natural frequency, so a frequency higher than the upper limit frequency used by the control circuit in dimming control enters the range of the next hilly resonance characteristic, and this makes normal control impossible to perform.

In this embodiment, when the oscillation period of a pulse power supply circuit 28 (FIG. 25) is substantially 20% to 100%, control similar to that of the control circuit shown in FIG. 24 is performed. Therefore, the oscillation frequency is higher than the resonance frequency, i.e., the control voltage Vctr is higher than the reference voltage Vref2. Accordingly, the voltage comparator 29 outputs "High", and the normal dimming operation described above is performed within the range of a relative brightness of about 10% to 100%.

If the oscillation period of the pulse power supply circuit 28 is adjusted to be shorter than 20%, a cold-cathode fluoresent lamp (load) 22 can no longer be dimmed (is turned off) as explained in the beginning of the fourth embodiment.

An operation of setting the oscillation period of the pulse power supply circuit 28 to 0% and again turning on the cold-cathode fluoresent lamp (load) 22 from the OFF state will be described below with reference to FIG. 39.

Figure 39:
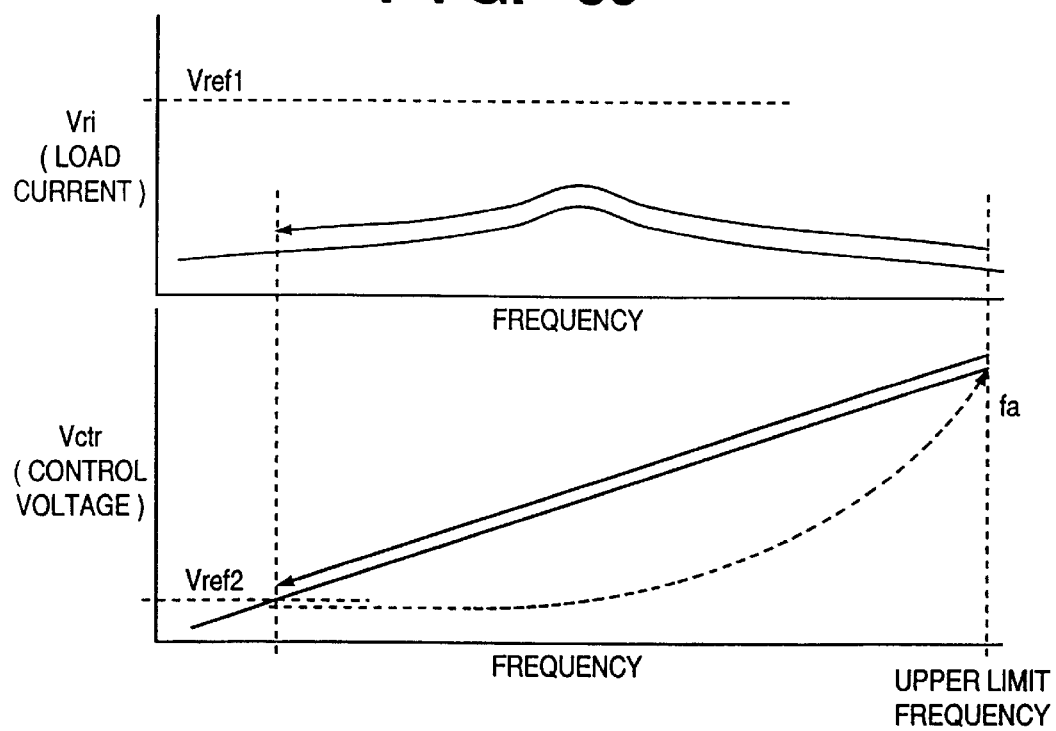
FIG. 39 is a graph for explaining the operation of the piezoelectric transformer control circuit as the fifth embodiment of the present invention.

FIG. 39 is a graph for explaining the operation of the piezoelectric transformer control circuit as the fifth embodiment of the present invention. FIG. 39 shows a load current detection voltage Vri and the control voltage Vctr as functions of the frequency of the oscillation signal of the voltage-controlled oscillation circuit 26A.

In this embodiment, when the oscillation period is set to 0% in a pulse oscillation circuit 28a of the pulse power supply circuit 28, the piezoelectric transformer 21 is not driven. Accordingly, the output voltage from the piezoelectric transformer 21 is substantially zero, and the load current is substantially zero. In the error amplifier 25, therefore, the load current detection voltage Vri becomes lower than a reference voltage Vref1. Consequently, the output control voltage Vctr from the error amplifier 25 decreases, and the oscillation frequency shifts to a lower frequency beyond the resonance frequency. When the control voltage Vctr becomes lower than the reference voltage Vref2, the voltage comparator 29 outputs "Low". As a consequence, the voltage-controlled oscillation circuit 26A outputs an oscillation signal for setting the upper limit frequency described above.

Even if the frequency of the oscillation signal is returned to the upper limit frequency fa by the voltage-controlled oscillation circuit 26A, the control voltage Vctr becomes lower again because the load current is substantially zero. Then, the control voltage Vctr becomes lower than the reference voltage Vref2. Finally, the oscillation signal is returned to the upper limit frequency fa again. Accordingly, when the control voltage Vctr of the error amplifier 25 becomes lower than the reference voltage Vref2 while the oscillation period is set to 0% in the pulse oscillation circuit 28a, the operation by which the voltage-controlled oscillation circuit 26A returns the frequency of the oscillation signal to the upper limit frequency fa is repeated (FIG. 39).

When the oscillation period is prolonged from this state, i.e., the state of a 0% oscillation period by adjusting the pulse oscillation circuit 28a in the pulse power supply circuit 28, an output voltage appears at the output of the piezoelectric transformer 21. As a consequence, a load current flows to turn on the cold-cathode fluoresent lamp (load 22). When the load current detection voltage Vri becomes higher than the reference voltage Vref1, the voltage-controlled oscillation circuit 26A returns to the normal dimming operation described previously.

As described above, the fifth embodiment can simultaneously achieve the function of holding the lamp current of the cold-cathode fluoresent lamp as a load substantially constant and the function of adjusting the brightness over the range of 0% to 100% of the oscillation period of the pulse power supply circuit, and can also reliably turn on the cold-cathode fluoresent lamp again from a 0% oscillation period.

<Modifications of Fifth Embodiment>

Figure 40:
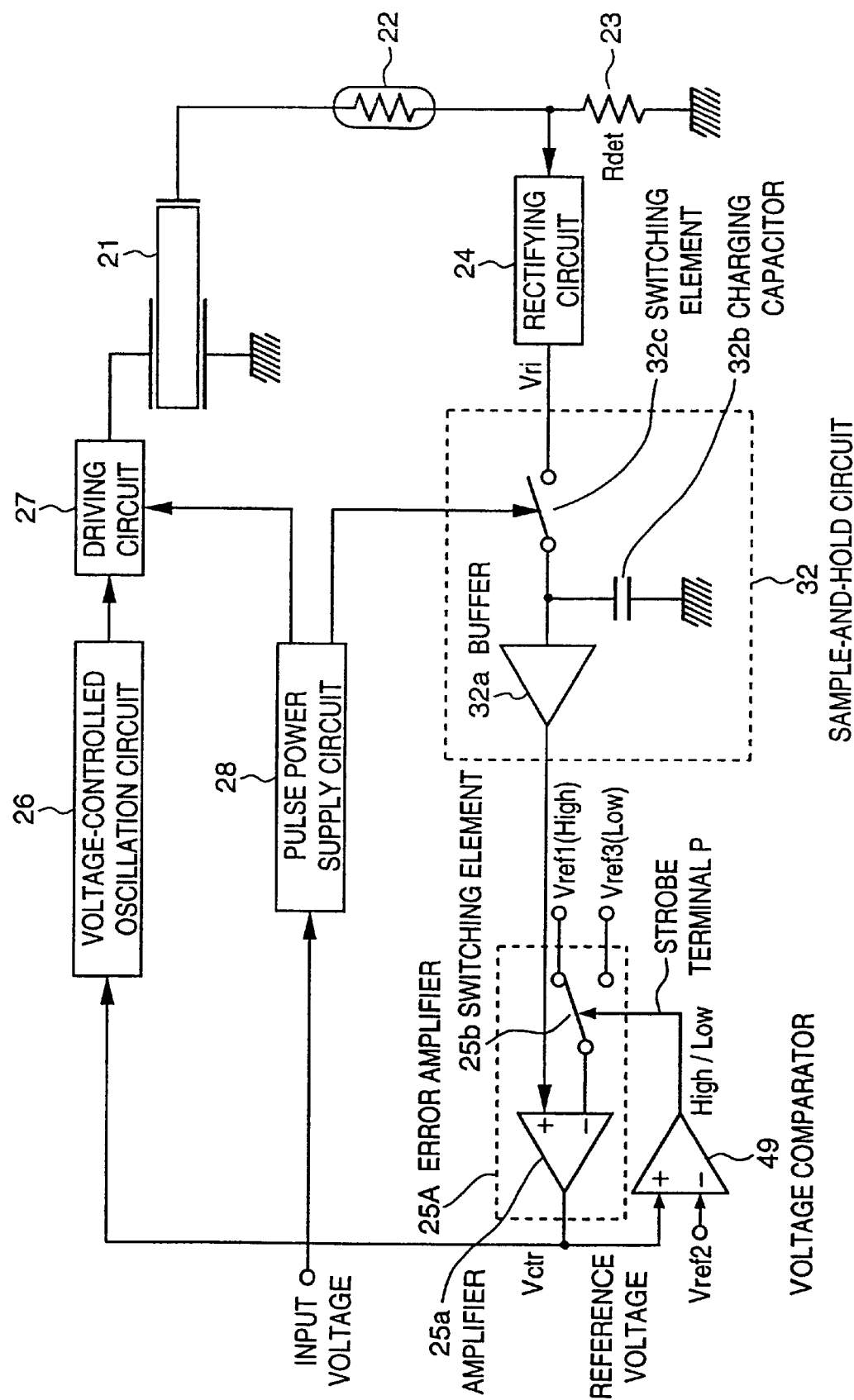
FIG. 40 is a block diagram of a piezoelectric transformer control circuit as the first modification of the fifth embodiment of the present invention.

FIG. 40 is a block diagram of a piezoelectric transformer control circuit as the first modification of the fifth embodiment of the present invention.

FIG. 40 differs from the arrangement shown in FIG. 37 in that a voltage-controlled oscillation circuit 26 does not include a strobe terminal, i.e., is the same as the one shown in FIG. 23 and, instead, an error amplifier 25A includes an amplifier 25a, a switching element 25b, and a strobe terminal P for switching reference voltages Vref1 and Vref3 to be applied to the amplifier 25a via the switching element 25b.

In this modification, if the control voltage Vctr to be applied to the voltage-controlled oscillation circuit 26 is higher than the reference voltage Vref2, a voltage comparator 49 outputs "High". Accordingly, the reference voltage Vref1 is applied to the negative input terminal of the error amplifier 25A. An operation when the reference voltage Vref1 is applied to the negative input terminal of the error amplifier 25A is similar to the normal dimming operation in the above-mentioned embodiment (FIG. 37), and a detailed description thereof will be omitted.

On the other hand, if the control voltage Vctr is lower than the reference voltage Vref2, e.g., if the oscillation period is set to 0% in the pulse oscillation circuit 28*a* and consequently the cold-cathode fluoresent lamp 22 is turned off, the voltage comparator 49 outputs "Low". Accordingly, a negative voltage, for example, is applied as the reference voltage Vref3 to the negative input terminal of the error amplifier 25A. In such state, a load current detection voltage Vri is constantly higher than the reference voltage Vref3, and the error amplifier 25A of this modification outputs a voltage, by which the voltage-controlled oscillation circuit 26 can return the frequency of the oscillation signal to the upper limit frequency fa, as the control voltage Vctr. Even with this circuit configuration, the same effect as in the control circuit shown in FIG. 37 can be obtained.

As the second modification of the fifth embodiment, a control circuit in which a so-called bridge type driving circuit including transistors is used as the driving circuit 27 shown in FIG. 37 will be described below with reference to FIG. 41.

Figure 41:
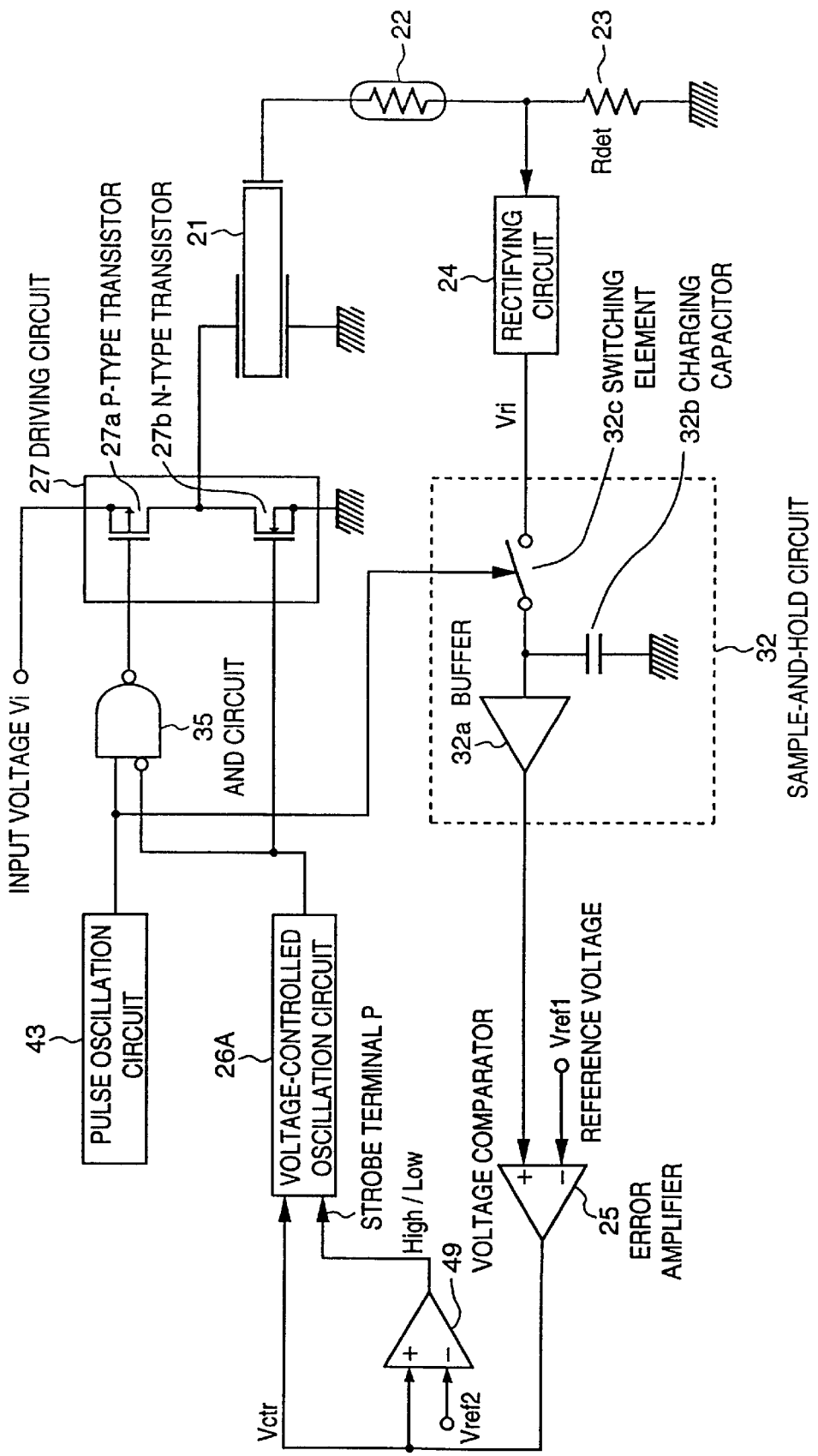
FIG. 41 is a block diagram of a piezoelectric transformer control circuit as the second modification of the fifth embodiment of the present invention.

FIG. 41 is a block diagram of a piezoelectric transformer control circuit as the second modification of the fifth embodiment of the present invention.

In the control circuit shown in FIG. 37, the piezoelectric transformer 21 is intermittently driven by intermittently driving the driving circuit 27 itself by the pulse power supply circuit 28. In this modification, on the other hand, a half-bridge circuit is used as the driving circuit 27, and the piezoelectric transformer 21 is intermittently driven by using a pulse oscillation circuit 43 and an AND circuit 35.

Referring to FIG. 41, the pulse oscillation circuit 43 includes an adjusting means (not shown) and can adjust the duty ratio of an output pulse signal. The AND circuit 35 outputs an AND signal of the output pulse signal from the pulse oscillation circuit 43 and the output oscillation signal from the voltage-controlled oscillation circuit 26A.

The driving circuit 27 of this modification includes a p-type transistor (FET: Field-Effect Transistor) 27*a* and an n-type transistor (FET) 27*b* which are so connected as to form a half-bridge circuit.

When the AND signal from the AND circuit 35 and the output oscillation signal from the voltage-controlled oscillation circuit 26A are input as the gate signal of the transistor to the high terminal and low terminal, respectively, of this driving circuit 27, the two transistors 27*a* and 27*b* alternately perform switching. Therefore, although the input voltage Vi is applied to the driving circuit 27, the driving voltage (AC voltage) whose amplitude is the input voltage Vi is intermittently applied to the piezoelectric transformer 21 by the switching operation of the two transistors 27*a* and 27*b*. Also, the output pulse signal from the pulse oscillation circuit 43 is supplied to a switching element 32*c* of a sample-and-hold circuit 32. In synchronism with this pulse signal, the switching of the switching element 32*c* is controlled in the same manner as in the embodiment shown in FIG. 37.

The rest of the arrangement is identical with the embodiment in FIG. 37. Therefore, the same reference numerals as in FIG. 37 denote the same parts in FIG. 41, and a detailed description thereof will be omitted. Even with this circuit configuration, the same effect as in the control circuit shown in FIG. 37 can be obtained.

The second modification is explained on the basis of the control circuit shown in FIG. 37. However, it is naturally possible to use the half-bridge type driving circuit 27 and use the pulse oscillation circuit 43 and the AND circuit 35, instead of the pulse power supply circuit 28, in the control circuit shown in FIG. 40. Also, the driving circuit 27 is not limited to a half-bridge circuit but can naturally be a full-bridge circuit.

As described above, the fifth embodiment can provide a control circuit and method for a piezoelectric transformer, capable of simultaneously achieving the function of holding the lamp current of the cold-cathode fluoresent lamp as a load substantially constant and the function of adjusting the brightness over a broad range by intermittent oscillation, and particularly capable of turning off and again turning on the cold-cathode fluoresent lamp by brightness adjustment.

That is, brightness adjustment is realized over the range of 0% to 100% of the oscillation period of the pulse power supply circuit or the pulse oscillation circuit. When it is detected that the oscillation frequency falls outside a predetermined control range, the oscillation frequency of the voltage-controlled oscillation circuit is returned to the upper limit value, thereby adjusting the oscillation period to be larger than 0%. Consequently, frequency control by which the lamp current is set to a predetermined value is restarted to turn on the cold-cathode fluoresent lamp again.

Note that the piezoelectric transformer control circuit of any of the above embodiments can be preferably used not only in driving a cold-cathode fluoresent lamp as a load but also in a display device using the cold-cathode fluoresent lamp. Also, when the piezoelectric transformer control circuit is used in a computer or a portable information terminal (PDA Personal Digital Assistants) including the display device, it is naturally possible to decrease the size and weight of the apparatus.

Additionally, when an ultraviolet lamp is driven by the piezoelectric transformer control circuit of any of the above embodiments, an object can be sterilized, deodorized, or decomposed by activation by ultraviolet rays irradiated by the lamp onto the object. That is, it is possible to provide, e.g., a sterilizing device or a water purification device using the ultraviolet lamp as a sterilization lamp or a deodorizing device using the ultraviolet lamp as a light source for exciting a catalyst.

Furthermore, the piezoelectric transformer control circuit of any of the above embodiments can be used in a high-voltage generator for driving an ozone generating device or a DC—DC converter.

As many apparently widely different embodiments of the present invention can be made without departing from the spirit and scope thereof, it is to be understood that the invention is not limited to the specific embodiments thereof except as defined in the appended claims.

What is claimed is:

1. A piezoelectric transformer control circuit for driving a cold-cathode fluorescent lamp connected to a piezoelectric transformer, the control circuit comprising:

oscillation means for generating an oscillation signal in accordance with a control voltage;

driving means for driving said piezoelectric transformer by an AC voltage generated in accordance with the oscillation signal from said oscillation means;

load current detecting means for detecting a current flowing in the cold-cathode fluorescent lamp connected to an output terminal of said piezoelectric transformer;

sample-and-hold means for sampling and holding the output from said load current detecting means in accordance with a predetermined control signal;

load current error output means for comparing an output from said sample-and-hold means with a predetermined value and outputting the control voltage in accordance with a result of the comparison; and intermittent oscillating means for intermittently driving said driving means by pulse-modulating a pulse signal, for intermittently driving said piezoelectric transformer, to be supplied to said driving means, wherein said sample-and-hold means outputs, to said load current error output means, a held voltage corresponding to the output from said load current detecting means during oscillation period of said intermittent oscillating means when said intermittent oscillating means does not oscillate, and said intermittent oscillating means can adjust a duty ratio of the pulse signal to be generated.

2. The circuit according to claim 1, wherein the predetermined control signal and the pulse signal are synchronized.

3. The circuit according to claim 1, wherein said intermittent oscillating means is a pulse power supply circuit which generates pulse voltage as the pulse signal from a DC voltage as a basis of the AC voltage.

4. The circuit according to claim 1, wherein said driving means includes a bridge type circuit arranged with a plurality of transistors, and said intermittent oscillating means comprises pulse oscillating means for generating a pulse signal, and logical product calculating means for calculating a logical product on the basis of the pulse signal from said pulse oscillating means and the oscillation signal from said oscillation means, and each of said transistors is driven by the oscillation signal from said oscillation means or an output signal from said logical product calculating means.

5. The circuit according to claim 4, wherein the output signal from said logical product calculating means is applied only to the transistor on a high side or a low side of said driving means.

6. The circuit according to claim 5, wherein the transistor on the low side or the high side, which is not applied the output signal from said logical product calculating means, is constantly turned on and off by applying the oscillation signal from said oscillation means.

7. The circuit according to claim 1, further comprising a comparator, wherein said oscillation means outputs an oscillation signal at a predetermined frequency different from a present oscillation frequency when a signal from the comparator indicates that the current flowing is smaller than a predetermined value.

8. The circuit according to claim 7, wherein the predetermined frequency different from a present oscillation frequency is a frequency at which an output voltage takes a minimum value in one of a plurality of resonance characteristics of said piezoelectric transformer, which are used by said control circuit.

9. The circuit according to claim 8, wherein when a higher frequency characteristic is higher than a frequency at which the output voltage takes a maximum value in the resonance characteristic used by said control circuit, the frequency at which the output voltage takes a minimum value is included in the higher frequency characteristic.

10. The circuit according to claim 7, further comprising output voltage detecting means for detecting an output voltage from said piezoelectric transformer, and wherein the current flowing is detected to be smaller than the predetermined value by said comparator on the basis of an output from said output voltage detecting means.

11. The circuit according to claim 7, wherein the current flowing is detected to be smaller than the predetermined value by said comparator on the basis of an output from said load current detecting means.

12. The circuit according to claim 7, further comprising duty ratio detecting means for detecting a duty ratio of the pulse signal generated by said intermittent oscillating means, and wherein the current flowing is detected to be smaller than the predetermined value by said duty ratio detecting means on the basis of the pulse signal generated by said intermittent oscillating means.

13. The circuit according to claim 5, wherein the predetermined value of the current flowing is substantially zero.

14. The circuit according to claim 13, wherein the cold-cathode fluoresent lamp is turned off when the current flowing is substantially zero.

15. The circuit according to claim 1, further comprising an amplifier, wherein said oscillation means outputs an oscillation signal at a predetermined frequency when a signal from the amplifier indicates that the oscillation frequency falls outside a predetermined control range.

16. The circuit according to claim 15, wherein the predetermined frequency is a frequency at which an output voltage takes a minimum value in one of a plurality of resonance characteristics of said piezoelectric transformer, which are used by said control circuit.

17. The circuit according to claim 16, wherein the predetermined control range contains the predetermined frequency and is included in a higher frequency characteristic higher than a frequency at which the output voltage from said piezoelectric transformer takes a maximum value in the resonance characteristic used by said control circuit.

18. The circuit according to claim 15, further comprising control voltage detecting means for detecting the control voltage for said oscillation means, and wherein said amplifier detects, on the basis of an output from said control voltage detecting means, that an oscillation frequency of said oscillation means falls outside the predetermined control range.

19. The circuit according to claim 1, wherein in pulse modulation performed for the pulse signal by said intermittent oscillating means, an OFF period length of the pulse signal is controlled.

20. The circuit according to claim 1, wherein in pulse modulation performed for the pulse signal by said intermittent oscillating means, a duty ratio in one cycle of the pulse signal is controlled.

21. The circuit according to claim 1, wherein said control circuit is used in a driving apparatus for an ultraviolet lamp instead of the cold-cathode fluoresent lamp.

22. A deodorizing device comprising the ultraviolet lamp according to claim 21 as a light source for exciting a catalyst.

23. A sterilizing device comprising the ultraviolet lamp according to claim 21 as a sterilization lamp.

24. A water purification device comprising the ultraviolet lamp according to claim 21 as a sterilization lamp.

25. A display device, wherein the cold-cathode fluoresent lamp is controlled by a piezoelectric transformer which is controlled by the circuit according to claim 1.

26. A computer comprising the display device according to claim 25 as display means.

27. A portable information terminal comprising the display device according to claim 25 as display means.

28. A piezoelectric transformer control method, for driving a cold-cathode fluorescent lamp connected to a piezoelectric transformer, of generating an oscillation signal in accordance with a control voltage and pulse-modulated signal and intermittently driving the piezoelectric transformer by an AC voltage generated in accordance with the oscillation signal, comprising the steps of:

detecting a current flowing in the cold-cathode fluoresent lamp connected to an output terminal of said piezoelectric transformer and controlling an oscillation frequency of the oscillation signal by controlling the control voltage such that the current flowing is held substantially constant;

sampling-and-holding a voltage signal corresponding to the current flowing in accordance with a predetermined control signal; and outputting a held voltage corresponding to the voltage signal during oscillation period of the pulse-modulated signal when the pulse-modulated signal is not oscillated, wherein brightness of the cold-cathode fluorescent lamp can be changed by adjusting a duty ratio of the pulse-modulated signal.

29. The method according to claim 28, further comprising a step of:

setting the oscillation frequency to a predetermined frequency different from a present oscillation frequency, if the current flowing is smaller than a predetermined value.

30. The method according to claim 29, wherein the predetermined frequency different from a present oscillation frequency is a frequency at which an output voltage takes a minimum value in one of a plurality of resonance characteristics of said piezoelectric transformer, which are used by said control method.

31. The method according to claim 30, wherein when a higher frequency characteristic is higher than a frequency at which the output voltage takes a maximum value in the resonance characteristic used by said control method is used, the frequency at which the output voltage takes a minimum value is included in the higher frequency characteristic.

32. The method according to claim 28, further comprising a step of:

setting the oscillation frequency to a predetermined frequency different from a present oscillation frequency, if the oscillation frequency falls outside a predetermined control range.

33. The method according to claim 32, wherein the predetermined frequency is a frequency at which an output voltage takes a minimum value in one of a plurality of resonance characteristics which are used by said control method of said piezoelectric transformer.

34. The method according to claim 33, wherein the predetermined control range contains the predetermined frequency and is included in a higher frequency characteristic higher than a frequency at which the output voltage from said piezoelectric transformer takes a maximum value in the resonance characteristic used by said control method.

* * * * *